(12) United States Patent
Ouchi

(10) Patent No.: US 6,597,713 B2
(45) Date of Patent: *Jul. 22, 2003

(54) APPARATUS WITH AN OPTICAL FUNCTIONAL DEVICE HAVING A SPECIAL WIRING ELECTRODE AND METHOD FOR FABRICATING THE SAME

(75) Inventor: Toshihiko Ouchi, Sagamihara (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/356,465

(22) Filed: Jul. 19, 1999

(65) Prior Publication Data
US 2003/0026303 A1 Feb. 6, 2003

(30) Foreign Application Priority Data

Jul. 22, 1998 (JP) .......................... 10-222286
Jul. 27, 1998 (JP) .......................... 10-226509

(51) Int. Cl.$^7$ ............................. H01S 3/04; H01S 5/00
(52) U.S. Cl. ............................. 372/36; 372/50
(58) Field of Search .............................. 372/43–50, 36; 385/88, 89; 438/122; 361/760

(56) References Cited

U.S. PATENT DOCUMENTS

| | | | |
|---|---|---|---|
| 5,073,041 A | 12/1991 | Rastani | 385/33 |
| 5,283,447 A | 2/1994 | Olbright et al. | 257/85 |
| 5,331,512 A * | 7/1994 | Orton | 361/760 |
| 5,349,598 A | 9/1994 | Ouchi et al. | 372/50 |
| 5,434,939 A * | 7/1995 | Matsuda | 385/88 |
| 5,512,750 A | 4/1996 | Yanka et al. | 250/338.4 |
| 5,594,577 A | 1/1997 | Majima et al. | 359/124 |
| 5,606,572 A | 2/1997 | Swirhun et al. | 372/96 |

(List continued on next page.)

FOREIGN PATENT DOCUMENTS

| | | | |
|---|---|---|---|
| EP | 0 899 835 | 3/1999 | H01S/3/025 |
| EP | 0 905 838 | 3/1999 | H01S/3/25 |
| JP | 6-237016 | 8/1994 | |
| JP | 8-186326 | 7/1996 | |
| JP | 9-15459 | 1/1997 | |

OTHER PUBLICATIONS

"Record Low–Threshold Index–Guided InGaAs/GaAIAs vertical–cavity Surface–emitting Laser with a Native Oxide Confinement Structure", Y. Hayashi, et al., Electronics Letters, No. 7, vol. 31, Mar. 30, 1995.

Kobayashi, et al., "Improvement of Coupling Efficiency for Passive Alignment of Stacked Multifiber Tapes to a Vertical–Cavity Surface–Emitting Laser Array", Jpn. J. Appl. Phys. vol. 36, pp. 1872–1875 (Mar. 1997).

*Primary Examiner*—Quyen Leung
(74) *Attorney, Agent, or Firm*—Fitzpatrick, Cella, Harper & Scinto

(57) ABSTRACT

An apparatus with an optical functional device includes a first substrate, a first optical functional device with a functional portion provided on the first substrate, a first wiring electrode for injecting a current into or applying a voltage to the functional portion of the first optical functional device, a second substrate, and a second wiring electrode. The first wiring electrode is formed on the first substrate and includes a first portion electrically connected to the functional portion, a first extension portion extending from the first portion to an outside of the functional portion and a first pad portion connected to the extension portion outside the functional portion, and the second wiring electrode is formed on the second substrate and includes a second pad portion and a second extension portion extending from the second pad portion. The first substrate and the second substrate are bonded to each other with the first pad portion and the second pad portion being electrically connected to each other.

36 Claims, 32 Drawing Sheets

U.S. PATENT DOCUMENTS

| | | |
|---|---|---|
| 5,654,814 A | 8/1997 | Ouchi et al. ............... 359/156 |
| 5,732,101 A | 3/1998 | Shin ........................... 372/92 |
| 5,742,418 A | 4/1998 | Mizutani et al. ............. 372/27 |
| 5,757,828 A | 5/1998 | Ouchi ......................... 372/27 |
| 5,774,616 A * | 6/1998 | Matsuda ...................... 385/89 |
| 6,025,213 A * | 2/2000 | Nemoto et al. ............. 438/122 |

* cited by examiner

US 6,597,713 B2

1

APPARATUS WITH AN OPTICAL FUNCTIONAL DEVICE HAVING A SPECIAL WIRING ELECTRODE AND METHOD FOR FABRICATING THE SAME

BACKGROUND OF THE INVENTION

1. Field of the Invention

The present invention relates to an apparatus with an optical functional device having a special wiring electrode, such as a surface emitting semiconductor device or a light receiving device, whose fabrication is easy, whose yield is high, and which can be suitably constructed as a two-dimensional array or the like. This invention also relates to a fabrication method of the above apparatus and apparatuses using the above apparatus, such as an optical transceiver apparatus, an optical interconnection apparatus and an optical recording apparatus.

2. Related Background Art

Recently, development of a solid-state light emitting device of a two-dimensional array type has been desired for purposes of its applications to a large-capacity parallel optical information processing, a high-speed optical connection, a high-speed optical recording and a panel-type display apparatus. Low cost, low consumption of an electric power, high productivity, and high reliability are required to achieve those applications. A variety of materials for such a solid-state surface emitting device have been studied and developed. It has been found that single-crystal semiconductors are notably suitable for reliability. In particular, development of a surface emitting device using compound semiconductors has been energetically advanced.

Among light emitting devices, a laser diode (LD) including reflection mirrors at its opposite ends is quite excellent in a light emitting efficiency, compared to devices using spontaneous emission. Therefore, the electric power consumption can be greatly lowered when those LDs are arranged in a two-dimensional form. In light of these facts, development of a VCSEL (vertical cavity surface emitting laser) has been actively advanced in recent years.

With the VCSEL, devices have been developed over a range from a blue color at a wavelength of about 400 nm to a communication wavelength band of 1.55 $\mu$m. Studies have been made in material series, such as AlGaN/InGaN series on a sapphire substrate, InGaAlP/InAlP and InGaAs/AlGaAs series on a GaAs substrate, and InGaAs/InGaAsP series on an InP substrate.

A fundamental structure of the two-dimensional arrayed VCSELs is illustrated in FIG. 1. Laser light is emitted perpendicularly to a substrate 1001. Each device is provided with highly-reflective coatings 1002 and 1004 of over 99% reflectivity at opposite ends of epitaxially-grown layers with a thickness of about several microns. A multiplicity of alternately-layered layers with different refractive indices and a common $\lambda/4$ thickness are used as the reflective mirror. The materials are generally dielectric or epitaxially-grown semiconductors (see, for example, an AlAs/GaAs mirror as disclosed in ELECTRONICS LETTERS, 31, p.560 (1995).

Regarding other elements shown in FIG. 1, reference numeral 1003 designates an active layer, reference numeral 1005 designates an insulating layer, reference numeral 1006 designates an electrode on the epitaxial layers, reference numeral 1007 designates a laser functional portion, reference numeral 1008 designates an electrode on the laser

2 substrate side, reference numeral 1009 designates a burying layer, reference numeral 1010 designates a window region formed in the electrode 1006, and reference numeral 1011 designates a laser cavity.

Several mounting or packaging methods of the VCSEL have also been proposed so far. Japanese Patent Laid-Open No. 8-186326 (1996), for example, discloses a mounting method in which the laser is thermally and electrically connected to a package and heat-sink substrate that is transparent to laser light, as illustrated in FIG. 2. In this case, a wiring electrode is formed on a portion of the heat sink corresponding to a portion of the VCSEL, and the electric connection is achieved by a solder heating or an ultrasonic-wave bonding between Au portions at the VCSEL portion.

In FIG. 2, reference numeral 1110 designates a resin mold body, reference numeral 1111 designates a laser electrode, reference numeral 1112 designates a laser substrate, reference numerals 1113 and 1117 designate reflective layers, reference numerals 1114 and 1116 designate cladding layers, reference numeral 1115 designates an active layer, reference numeral 1118 designates a current blocking layer, reference numeral 1119 designates a contact layer, reference numeral 1120 designates a package window (also referred to, herein, as a heat sink window), and reference numeral 1121 designates an electrode on the package window side.

Further, Japanese Patent Laid-Open No. 6-237016 (1994) discloses another mounting method in which a wiring electrode is formed on a substrate 1201 with an electronic circuit, the wiring electrode is electrically connected to a VCSEL 1203 and an optical fiber 1210 is inserted into a hole formed in a VCSEL substrate 1202. Herein, a transistor 1204 is arranged under the VCSEL 1203, and a cathode of the VCSEL 1203 is connected to a collector of the transistor 1204 as illustrated in FIG. 3.

Regarding other elements shown in FIG. 3, reference numeral 1205 designates an emitter electrode, reference numeral 1206 designates a base electrode, reference numeral 1207 designates an anode electrode, reference numeral 1208 designates an insulating layer, reference numeral 1209 designates a guide hole, and reference numeral 1211 designates an adhesive.

Further, Japanese Patent Laid-Open No. 9-15459 (1997) discloses a mounting method of arrayed VCSELs in which a wiring 1304 is formed on a support substrate 1305 and the wiring 1304 is connected to each VCSEL 1302 as illustrated in FIG. 4.

In FIG. 4, reference numeral 1301 designates a semiconductor substrate, reference numeral 1303 designates a guide for an optical fiber, reference numeral 1306 designates an optical fiber tape, reference numeral 1307 designates a core of the fiber, reference numeral 1308 designates a clad of the fiber, reference numeral 1309 designates a core wire of the optical fiber, reference numeral 1310 designates a coating material, reference numeral 1311 designates a light beam, and reference numeral 1312 designates a length of an exposed portion of the core wire 1309 of the optical fiber.

In those prior art mounting methods, VCSELs with an electrode pad formed on an upper surface (i.e., a surface of epitaxial layers) of each VCSEL are bonded to a wiring substrate with an electrode pad corresponding to each VCSEL while electrical connections between pairs of these pads are maintained. In such mounting methods, however, an alignment precision is required when the pads on the VCSEL and the wiring substrate are bonded, especially where the density of a two-dimensional array of VCSELs is great or where the electrode pad is made small to secure a preferable rapid response. The reason therefor is that the pads must be precisely positioned and in addition thereto the alignment and bonding must be performed such that the pad would not be brought into contact with other wirings on the wiring substrate. As the density increases, such undesired contact is more likely to occur since a number of wirings are formed between the pads. Accordingly, in such methods wherein mutually-bonding faces cannot be directly monitored, the alignment is difficult to achieve and yield and productivity decrease.

Further, the uses of solder to perform bonding cause several problems. For example, the melted solder flows into a window through which laser light emerges and blocks the laser light. Also, a resistance of an ohmic contact with the VCSEL rises since the solder melts an Au electrode. Additionally, when the Au electrodes are directly bonded by ultrasonic waves, the VCSEL is likely to be damaged and less effective if the bonding point is close to the VCSEL.

Further, in the prior art structure of FIG. 2, when light emerging from the VCSEL through the heat sink window 1120 is spatially transmitted or coupled to an optical fiber, a lens is needed and the optical system thus becomes complicated, leading to an increase in cost.

In the prior art structure of FIG. 3, since the VCSEL substrate 1202 needs to be transparent to laser light, a usable wavelength band of the laser is limited. In FIG. 3, though the substrate 1202 appears to be completely removed to form the guide hole 1209, it is actually difficult to completely remove a portion of the substrate 1202 between the VCSEL 1203 and the guide hole 1209. Therefore, the VCSEL substrate 1202 must be transparent to the laser light as noted above. Further, FIG. 3 shows a structure of the guide hole 1209 formed in the VCSEL substrate 1202 to couple the laser light to the optical fiber 1210. There are, however, problems in that an alignment of the guide hole 1209 is difficult to perform, coupling loss cannot be reduced since the laser light is coupled to the optical fiber 1210 without any lenses and that the laser is likely to be injured when the optical fiber 1210 is inserted.

Furthermore, when a laser is actually driven by a constant driving current only, it is difficult to maintain an output power of the laser at a constant magnitude due to adverse influences of its ambient temperature and history. Therefore, an automatic power control (APC) is normally employed. FIG. 5 illustrates a structure therefor. In FIG. 5, laser light is generally emitted from opposite sides of two cavity mirrors of a laser diode (LD) 2200. One of the light outputs is monitored by a photodiode 2201, so that the laser output is maintained at a constant magnitude by comparing the monitored value with a reference voltage 2202 by a differential amplifier 2203 and negatively feeding its comparison result back to a driving current of the laser 2200. In FIG. 5, reference numeral 2204 denotes an LD current controlling circuit, reference numerals 2205, 2206 and 2207 denote resistors and reference numeral 2208 denotes an optical fiber.

Herein, in the case of an end-facet emitting laser 2309 as illustrated in FIG. 6, generally the laser 2309 and a photodiode (PD) 2310 are mounted on a common support and the laser output is monitored. Regarding other elements shown in FIG. 6, reference numerals 2311 and 2312 denote lead wires, reference numeral 2313 denotes a cap, reference numeral 2314 denotes a window plate, and reference numeral 2315 denotes a stem. In the case of VCSEL, however, there is a light output from only one of the cavity mirrors since its entire substrate is bonded as illustrated in FIG. 2.

Accordingly, when the APC is carried out in the VCSEL, it is necessary to divide one output into two by a prism and optically create monitoring light. Hence, the optical system becomes complicated and the number of components increases, leading to an increase in cost. Further, an actual output power decreases since a portion of the light output is taken out for monitoring, and hence the amount of a laser driving current needs to be increased in order to obtain a necessary output power. Its power requirements thus rise inevitably.

SUMMARY OF THE INVENTION

An object of the present invention is to provide an apparatus with an optical functional device having a special wiring electrode, such as a surface emitting semiconductor device, a light receiving device, whose fabrication is easy, whose yield is high, and whose cost can be relatively low, and a fabrication method of the above apparatus and apparatuses using the above apparatus, such as an optical transceiver apparatus, an optical interconnection apparatus and an optical recording apparatus.

An apparatus with an optical functional device for achieving the object of the present invention includes a first substrate, a first optical functional device with a functional portion provided on the first substrate, a first wiring electrode for injecting a current into or applying a voltage to the functional portion of the first optical functional device, a second substrate, and a second wiring electrode. Herein, the first wiring electrode is formed on the first substrate and includes a first portion electrically connected to the functional portion, a first extension portion extending from the first portion to an outside of the functional portion and a first pad portion connected to the extension portion outside the functional portion, and the second wiring electrode is formed on the second substrate and includes a second pad portion and a second extension portion extending from the second pad portion. The first substrate and the second substrate are bonded to each other with the first pad portion and the second pad portion being electrically connected to each other. Due to such a structure, an alignment precision and damages to the optical functional device at the time of bonding can be reduced or eliminated, irrespective of pitches between the optical functional devices (where plural devices are arranged) and device's size.

Based on the above fundamental structure, the following specific structures are possible with the following technical advantages.

At least one of input light and output light travels into and from the first optical functional device on a side of the first substrate. In this case, a portion of the first substrate corresponding to the functional portion of the first optical functional device may be removed to form a window region, which achieves the light input and output on the first substrate side independently from a wavelength treated by the first optical functional device. Alternatively, the first substrate may be formed of material transparent to light which is treated by the first optical functional device.

At least one of input light and output light travels into and from the first optical functional device on a side of the second substrate. In this case, the second substrate may be formed of material transparent to light which is treated by the first optical functional device.

Further, a guide unit for guiding the above at least one of input light and output light into and from the first optical functional device can be provided at a portion of the second substrate corresponding to a location of the first optical functional device. An efficiency of optical coupling of the light input or output to the first optical functional device can be increased due to this structure. In this case, the guide unit may be a microlens or a Fresnel lens formed in the second substrate. The efficiency of optical coupling can be increased due to a light collimating and condensing function of such a lens. Further, the guide unit may be an optical fiber fixed to the second substrate. In this case, a hole may be formed in the second substrate, and the optical fiber may be fixed into the hole. Thus, the first optical functional device and the optical fiber can be integrally arranged.

Further, a third substrate with a hole bonded to the second substrate may be provided, and the an optical fiber may be fixed in the hole.

The first optical functional device can be a surface emitting light-radiating device for emitting light perpendicular to the first substrate (typically, a vertical cavity surface emitting laser (VCSEL) with an active layer sandwiched between a pair of reflective mirrors). The first optical functional device can also be a photodetector for converting received light to an electric signal.

Further, a photodetector can be provided on the second substrate when the first optical functional device is a surface emitting light-radiating device for emitting light perpendicular to the first substrate. In this structure, a light output of the light-radiating device can be monitored by the integrally arranged photodetector without attenuating the light output of the light-radiating device and increasing the number of components.

The photodetector may be positioned oppositely to the surface emitting light-radiating device to receive light from the surface emitting light-radiating device. The photodetector may also be positioned oppositely to the surface emitting light-radiating device to receive both external light and light from the surface emitting light-radiating device. In this case, the photodetector may be positioned on a face of the second substrate opposite to a face of the second substrate bonded to the first substrate to receive the external light. The photodetector may also be positioned on a portion of the second substrate, at which material of the second substrate is removed to form a window region, to receive the external light. High performance can be attained when the photodetector can also receive the external light.

The second pad portion of the second wiring electrode is preferably formed outside the photodetector.

Further, a third wiring electrode may be formed on the second substrate for the photodetector. The third wiring electrode includes a third portion electrically connected to the photodetector, a third extension portion extending from the third portion to an outside of the photodetector and a third pad portion connected to the third extension portion outside the photodetector.

The photodetector may be a pin-photodiode, and an electrode of the pin-photodiode is the third wiring electrode while another electrode of the pin-photodiode is formed on an entire face of the second substrate opposite to a face of the second substrate on which the photodetector is provided. Alternatively, the photodetector may be a metal-semiconductor-metal (MSM)-photodiode, and an electrode of the MSM-photodiode is the third wiring electrode while another electrode of the MSM-photodiode is another wiring electrode drawn from the MSM-photodiode to an outside of the MSM-photodiode.

Further, a plurality of arrayed photodetectors may be provided on the second substrate corresponding to a plurality of the first optical functional devices provided on the first substrate.

The photodetector can receive light from the surface emitting light-radiating device and feedback controls the surface emitting light-radiating device based on the received light such that a light output of the surface emitting light-radiating device can be stabilized.

The photodetector can receive both external light and light from the surface emitting light-radiating device and feedback controls the surface emitting light-radiating device based on the received light such that a light output of the surface emitting light-radiating device can be stabilized and that the surface emitting light-radiating device can act as an optical inverter.

Further, the first pad portion and the second pad portion may be bonded with solder, anisotropic electrically-conductive adhesive, or electrically-conductive adhesive. The first pad portion and the second pad portion may also be bonded by pressing the first and and second pad portions against each other.

A metal bump for radiating heat generated by the functional portion of the first optical functional device to the second substrate may be provided. The metal bump is placed between the functional portion and the second substrate, and said metal bump being electrically independent.

Resin may be packed in a space created between the functional portion of the first optical functional device and the second substrate to strengthen a mechanical bonding between the first and second substrates.

Further, the second substrate with the second wiring electrode may be mounted to a package or a print-circuit board directly or through another substrate with a wiring electrode.

The first substrate may be entirely bonded to an inner surface of a package acting as a heat sink.

The second substrate can be a substrate of a semiconductor single crystal, and the second substrate may include an electronic functional device, a driver for the electronic functional device and a controller for the electronic functional device integrated on the second substrate.

The first substrate may include a groove structure for preventing a short circuit through an end facet of the first substrate. The groove structure is formed around the functional portion of the first optical functional device.

Further, a plurality of arrayed first optical functional devices may be provided in an integrated form on the first substrate, and the plurality of first pad portions respectively connected to the plurality of arrayed first optical functional devices may be respectively extended from the plurality of first portions to a region outside of the first optical functional devices. In this case, a groove for preventing optical, electric and thermal interference between the plurality of first optical functional devices may be formed between the plurality of first optical functional devices.

The first wiring electrode may be formed for each first optical functional device such that each first optical functional device can be independently driven. The first wiring electrode may also be formed such that the first optical functional devices can be driven in a matrix manner.

A substrate structure for achieving the object of the present invention includes a substrate, an optical functional device with a functional portion provided on the substrate, and a wiring electrode for injecting a current in or applying a voltage to the functional portion of the optical functional device. Herein, the wiring electrode is formed on the substrate and includes a portion electrically connected to the functional portion, an extension portion extending from the portion to an outside of the functional portion and a pad portion connected to the extension portion outside the functional portion.

A substrate structure for achieving the object of the present invention includes a substrate and a wiring electrode formed on the substrate and including a pad portion and an extension portion extending from the pad portion. The substrate structure also includes an optical functional device and another wiring electrode formed on the substrate for the optical functional device. Herein, the another wiring electrode includes another portion electrically connected to the optical functional device, another extension portion extending from the another portion to an outside of the optical functional device and another pad portion connected to the another extension portion outside the optical functional device, and wherein the pad portion of the wiring electrode is formed outside the optical functional device.

A fabrication method of the above apparatus with an optical functional device and an optical fiber for achieving the object of the present invention includes the steps of:

forming the surface emitting light-radiating device and the first wiring electrode on the first substrate;

forming the second wiring electrode on the second substrate;

bonding the first substrate and the second substrate to each other;

injecting a current into the surface emitting light-radiating device to oscillate the surface emitting light-radiating device;

aligning a photomask with one of the second substrate and the third substrate bonded to the second substrate using the oscillated light as an alignment mark;

performing a patterning on one of the second substrate and the third substrate using the photomask to form a pattern on one of the second substrate and the third substrate; and etching the hole in one of the second substrate and the third substrate using the pattern.

Further, an optical recording apparatus for achieving the object of the present invention includes the above apparatus with an optical functional device, and a unit for projecting signal-carrying light from the apparatus with an optical functional device on a recording medium.

An optical transceiver apparatus for achieving the object of the present invention includes an optical transmitter of the above apparatus with an optical functional device, and an optical receiver. The optical functional device includes a photodetector provided on the second substrate. In this case, the above apparatus with an optical functional device can act as both the optical transmitter and the optical receiver. The optical transceiver apparatus can perform an inter-board parallel transmission and a signal processing and is constructed as an optical interconnection apparatus.

These advantages and others will be more readily understood in connection with the following detailed description of the preferred embodiments in conjunction with the drawings.

DESCRIPTION OF THE PREFERRED EMBODIMENTS

First Embodiment

Figure 1:
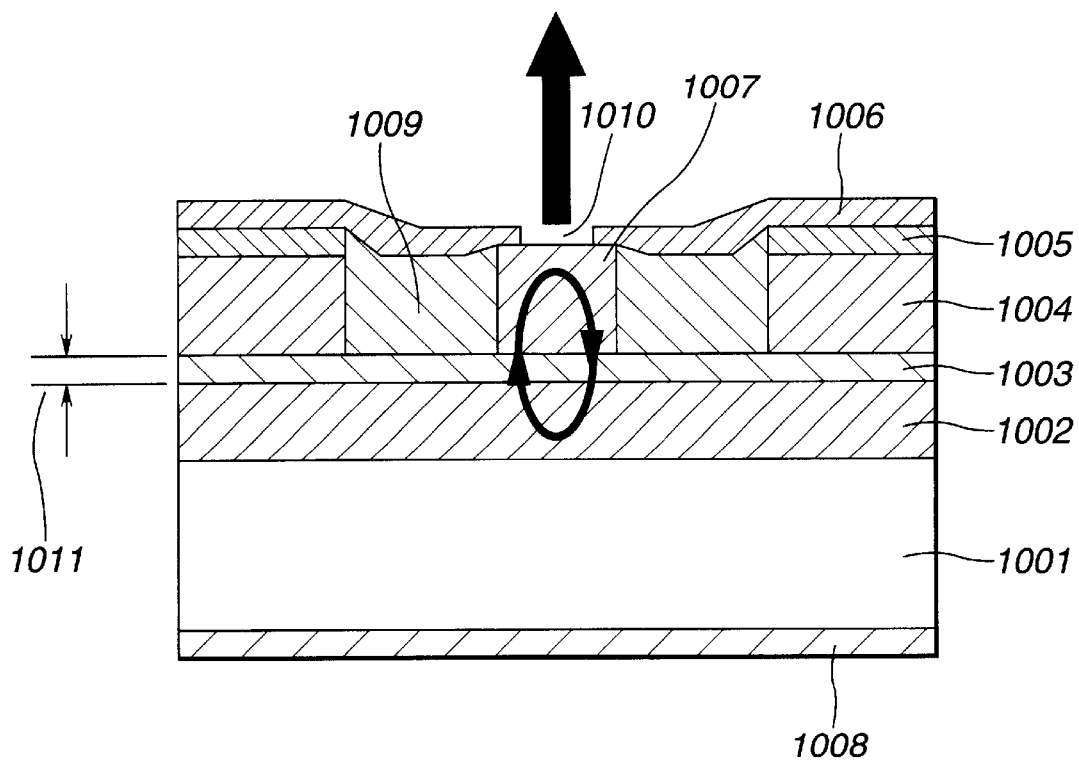
FIG. 1 is a cross-sectional view illustrating the structure of a first prior art VCSEL.
Figure 2:
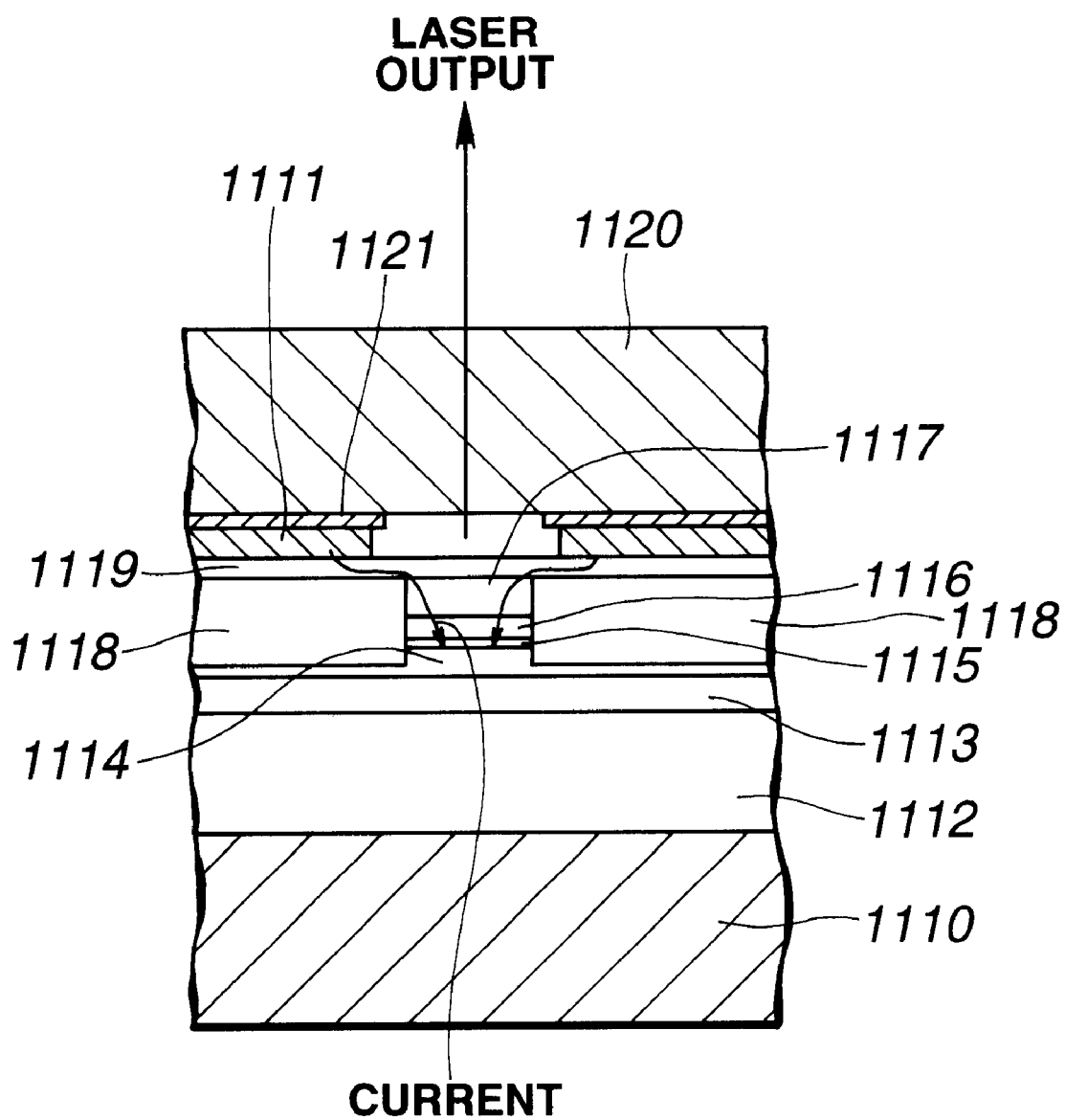
FIG. 2 is a cross-sectional view illustrating the structure of a second prior art VCSEL with a wiring and heat-sink substrate.
Figure 3:
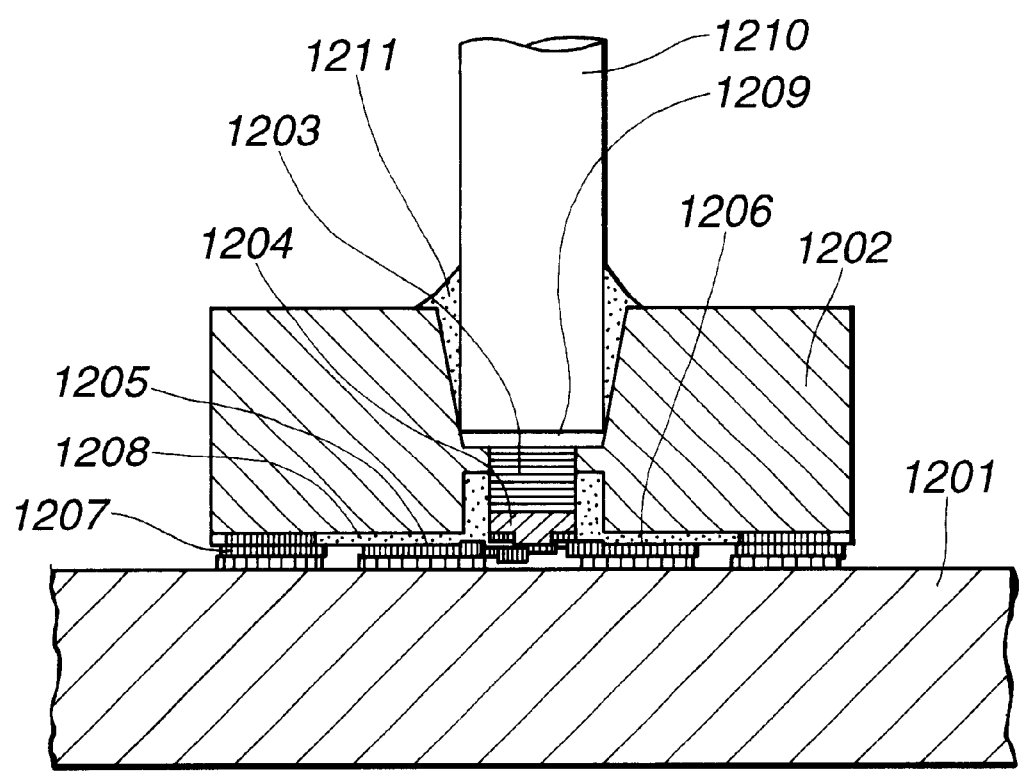
FIG. 3 is a cross-sectional view illustrating the structure of a third prior art VCSEL with an electronic-circuit substrate.
Figure 4:
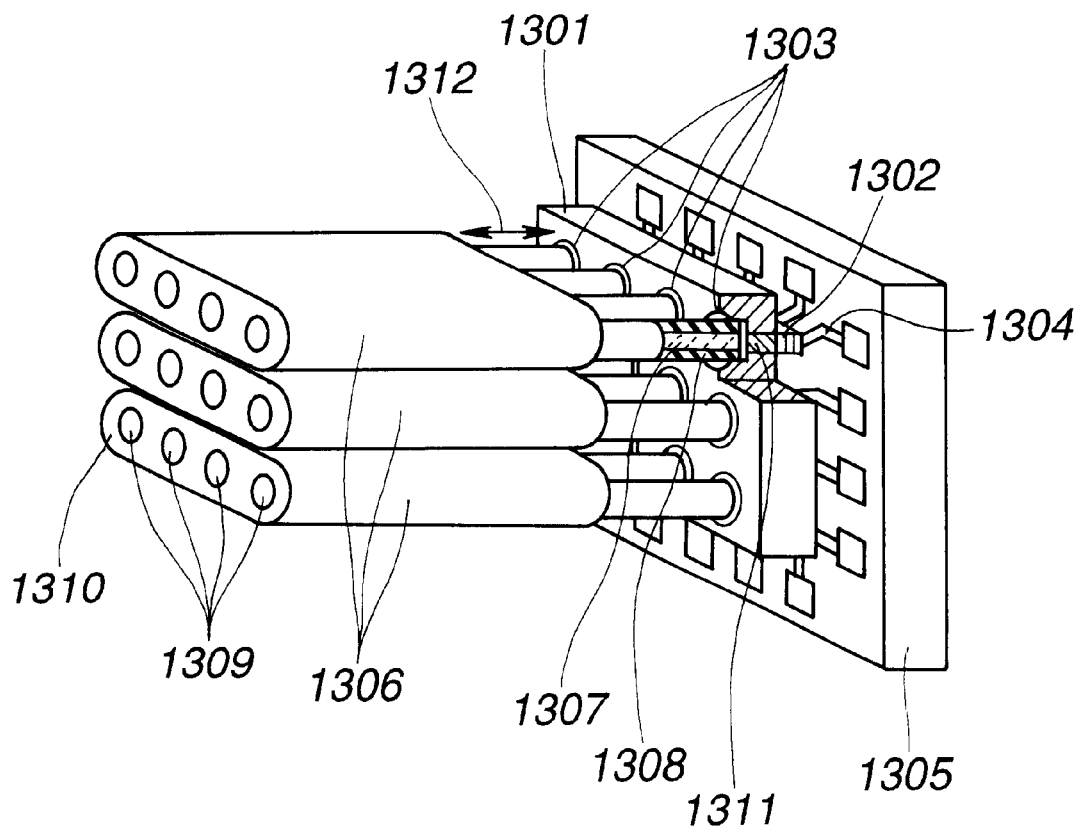
FIG. 4 is a perspective view illustrating the structure of a fourth prior art actual mounting configuration of a VCSEL array to a wiring substrate.
Figure 5:
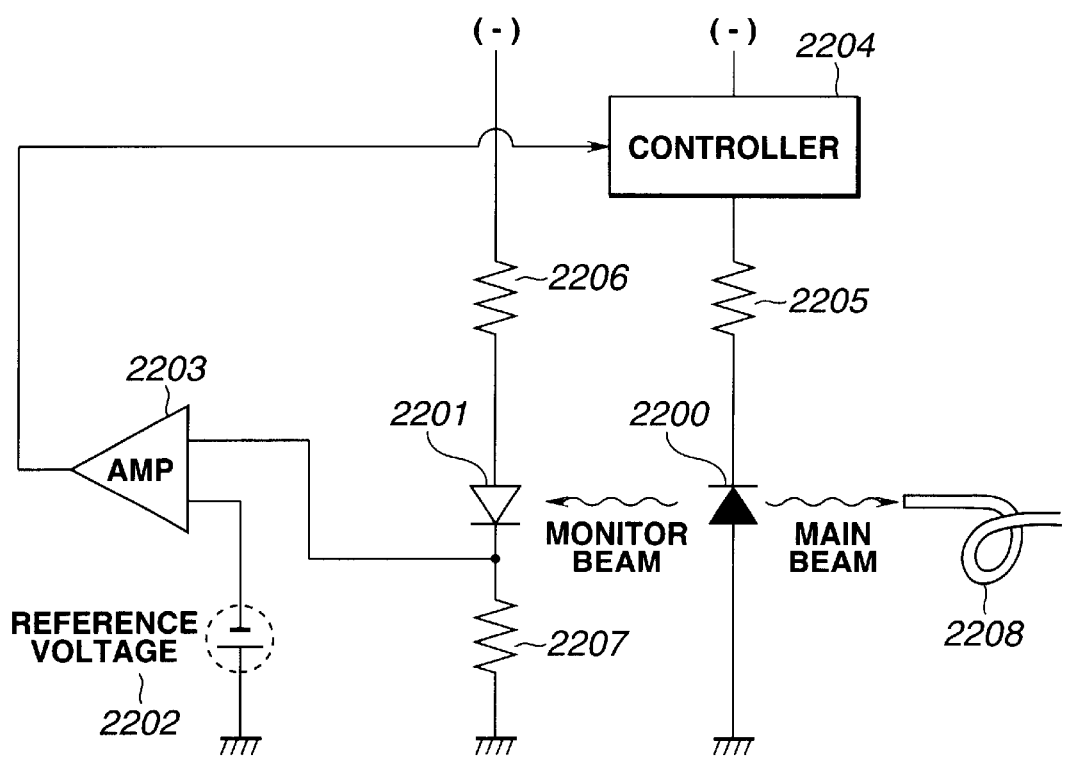
FIG. 5 is a schematic diagram of an ordinary prior art APC circuit.
Figure 6:
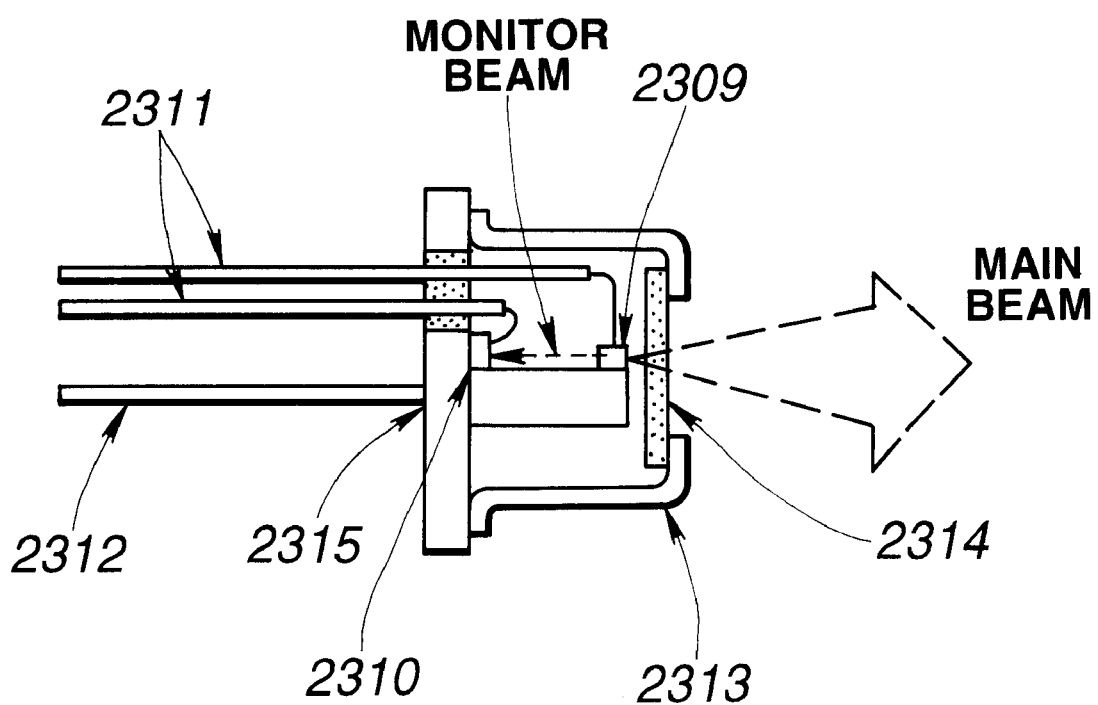
FIG. 6 is a cross-sectional view illustrating the structure of a prior art laser module with a monitoring PD.

A first embodiment of the present invention is directed to an 8×8 two-dimensional VCSEL array in which each VCSEL of AlGaAs/GaAs series with a 0.98-μm wavelength band is grown on a GaAs substrate. In a VCSEL wafer 21 (also referred to, herein, as the entire chip 21 and the VCSEL substrate 21), shown in FIG. 7, a single-wavelength cavity 3 composed of a strained dual quantum well active layer of InGaAs/GaAs and an AlGaAs spacer layer is formed on a GaAs substrate 1. The cavity 3 is sandwiched between distributed Bragg reflector (DBR) mirrors 2 and 4 formed of a ¼-wavelength-thickness multi-layer of AlAs/AlGaAs (about twenty to thirty pairs). These layers are epitaxially grown on the substrate 1 by a metal organic vapor phase epitaxy (MOVPE) method or the like. An uppermost layer of the DBR mirror 4 is composed of a highly-doped GaAs layer for readily making an electrode contact.

After etching is annularly performed down to a neighborhood of the active layer 3, a thus-formed groove is buried with a polyimide 9 to flatten the surface and an insulating layer 5 of $SiN_x$ or the like is formed. Then, a window is formed in the insulating layer 5 and an electrode 6 is formed thereat. A current constriction into a light radiation region 8 is thus achieved. Here, AlAs layers on a side of the DBR mirror 4 exposed by the annular etching may be selectively oxidized to further strengthen the current constriction structure.

Figure 8:
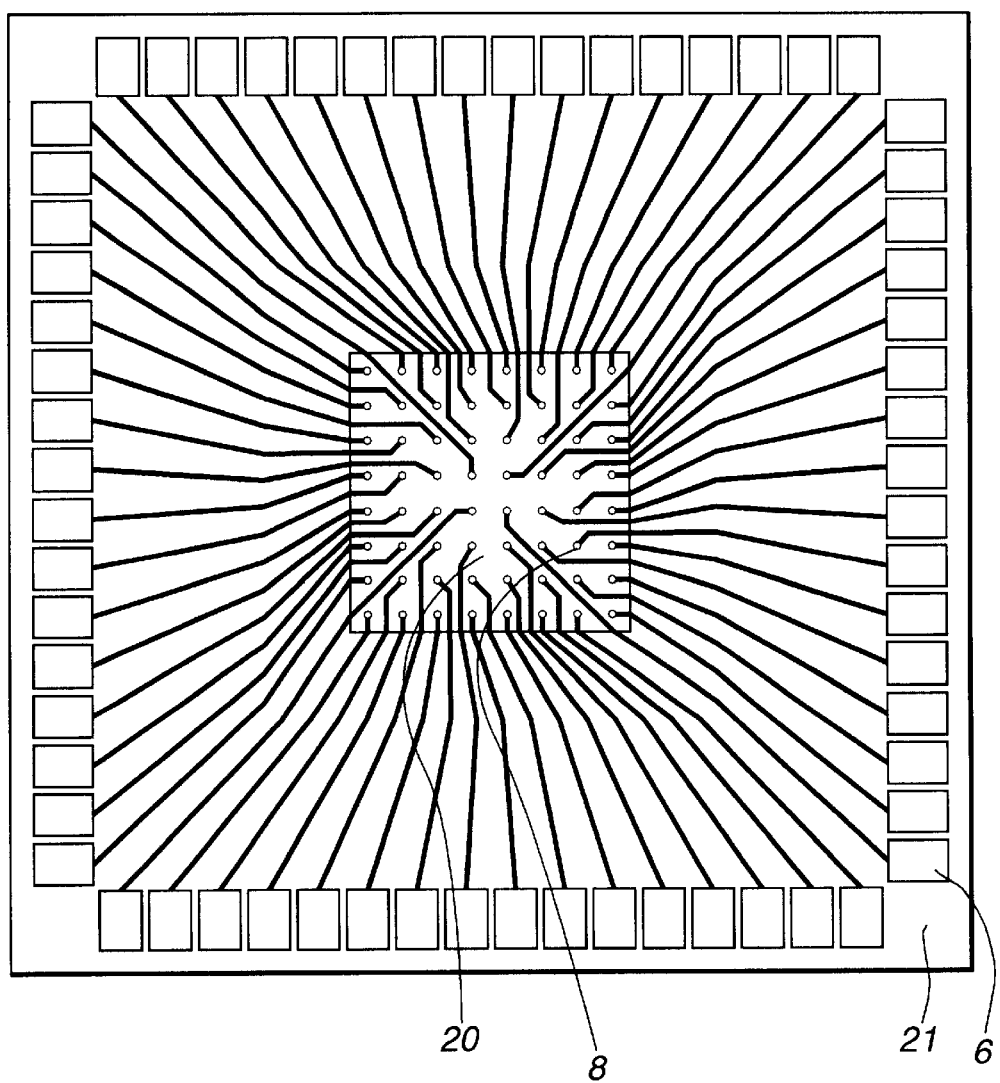
FIG. 8 is a plan view illustrating the structure of a VCSEL-array substrate according to the present invention.

The electrode 6 has such a wiring pattern as illustrated in FIG. 8 that an electrode pad 6 is drawn outside a VCSEL array region 20 (In this specification, respective portions, such as a portion connected to a device, an extension portion therefrom and an electrode pad, of the electrode pattern are designated by a common reference numeral). In this embodiment, the electrode 6 is formed of Cr/Au deposited by a vacuum evaporation. However, where the electrode 6 is relatively long, the electrode 6 may be formed of a thick Au plating to decrease its resistance. Further, the electrode pattern 6 can be formed of a contact/barrier/wiring layer of Ti/Pt/Au or the like to increase a close contact at the time of soldering and reduce a contact resistance between the electrode and semiconductor. Herein, Ti is superior in its close contact with semiconductor, Pt is indissoluble to solder and, hence, can be a barrier, and Au dissolves in solder to create an alloy.

With respect to sizes of this embodiment, the radiation region 8 of VCSEL has a diameter of 10 μm, an interval between the radiation regions 8 is 125 μm, an area of a VCSEL array region 20 is 875 μm-square, and an area of the entire chip 21 is 3 mm-square. Naturally these dimensions can be changed freely. An electrode 7 of the VCSEL on the side of the GaAs substrate 1 is formed of AuGe/Au. Material of the electrode 7 in a portion of the array region 20 is removed such that laser light can be taken from the substrate side. It should be noted that the GaAs substrate 1 is trasparent to light at a 0.98-μm band.

Figure 7:
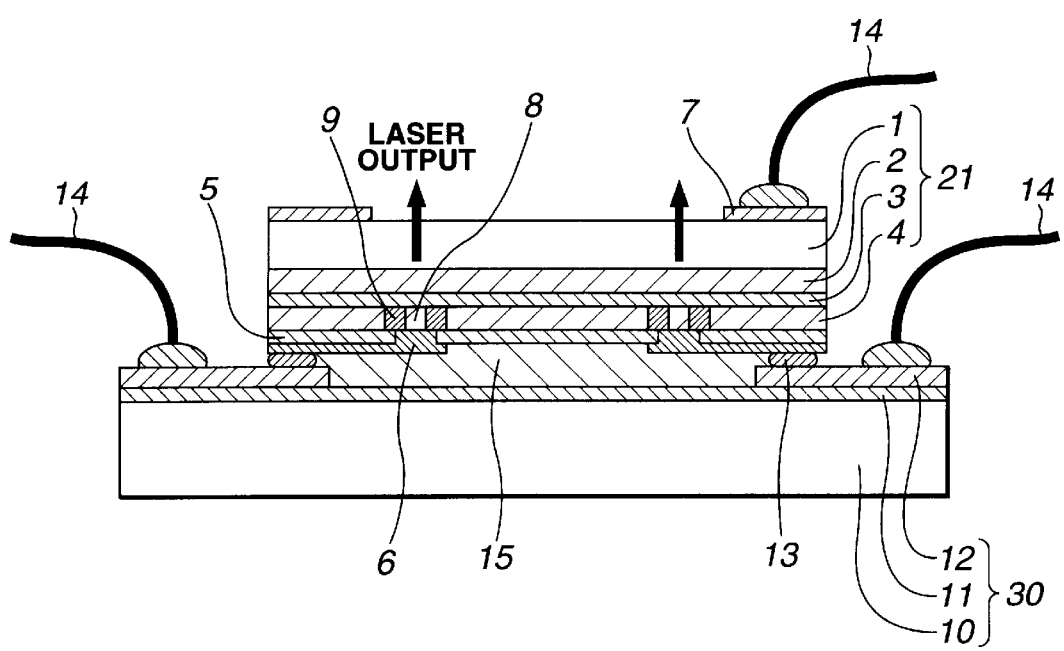
FIG. 7 is a cross-sectional view illustrating the structure of a VCSEL array of a first embodiment according to the present invention.
Figure 9:
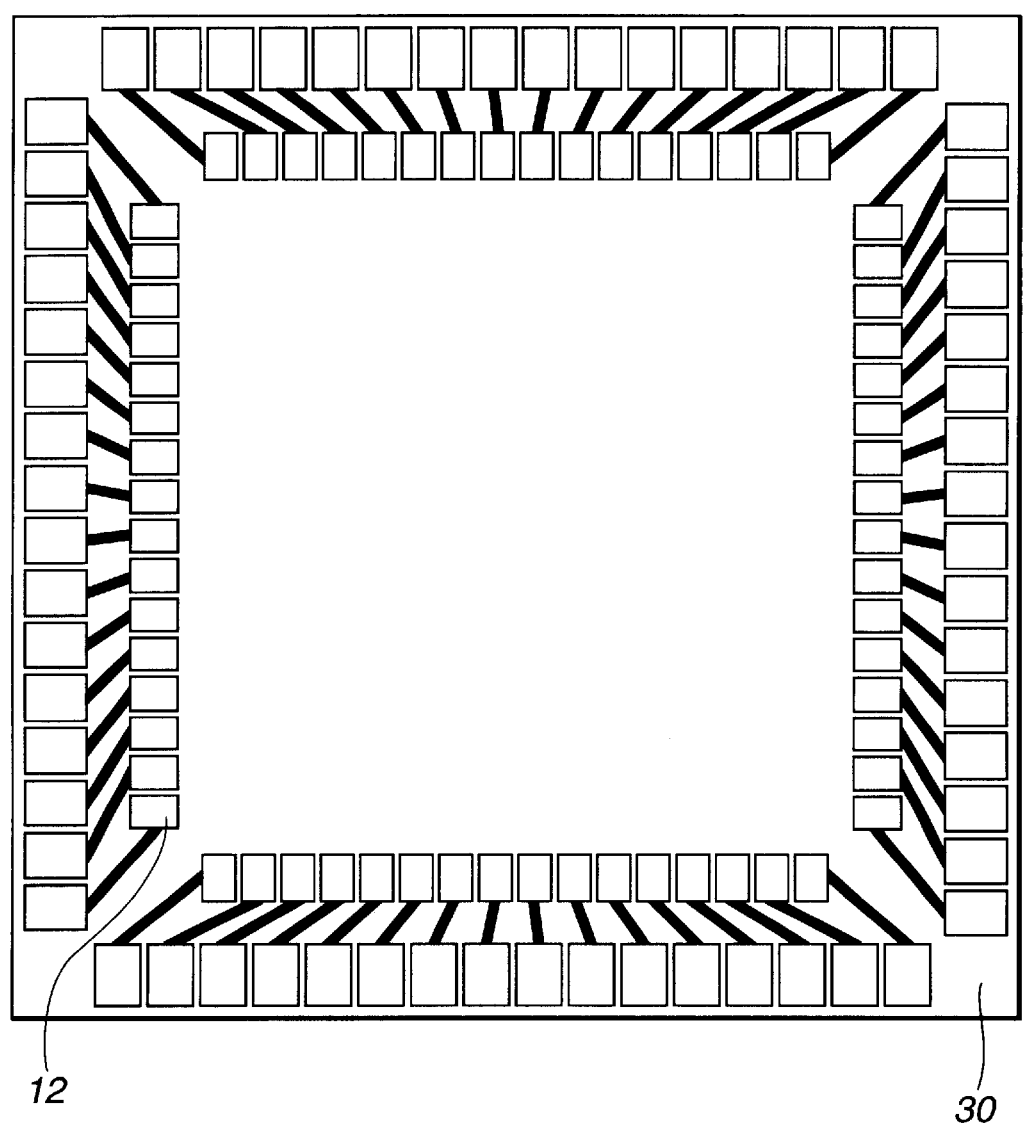
FIG. 9 is a plan view illustrating the structure of a wiring substrate according to the present invention, to which a VCSEL-array is to be bonded.

On the other hand, an electrode pattern 12 as illustrated in FIG. 9 is formed on a sub-mount 30 (also referred to, herein, as wiring substrate 30) to which the VCSEL substrate 21 is mounted. In the electrode pattern 12, an electrode pad 12 is arranged corresponding to the electrode pad on the side of the VCSEL radiation region 8 and this electrode pad is drawn outside to an outer electrode pad (see FIG. 9). In the sub-mount 30, an $SiO_2$ layer 11 is formed on an Si substrate 10 by thermal oxidization and the electrode pattern 12 is formed of Cu/Ni/Au on the $SiO_2$ layer 11 by plating or the like, as illustrated in FIG. 7. A solder 13 is formed on the electrode pad 12 by plating or the like. Thus, the VCSEL substrate 21 and the wiring substrate 30 can be readily connected electrically and mechanically by aligning and heating them.

The electric connection between the VCSEL substrate 21 and the wiring substrate 30 can also be achieved by pressing the Au electrodes against each other or applying ultrasonic waves to a connection portion, other than using the solder. Further, an anisotropic electrically-conductive adhesive containing electrically-conductive particles (whose size is about 4 μm to 10 μm) may also be used (i.e., this adhesive is applied to the connection portion and pressure and heat are applied thereto). In this case, when the Au electrode pattern is made with a thickness of more than 10 μm by the plating, the anisotropy of the adhesive (conductivity exists in a perpendicular direction but not in a lateral direction) can be utilized since this thickness is larger than the size of the conductive particles. Thus, the corresponding electrodes 6 and 12 can be electrically connected with good yield while insulation between adjacent wiring electrodes is secured.

A spacing 15 formed by the connection of the electrodes 6 and 12 may be maintained as it is, or filled with resin or the like. In this embodiment, the wiring pattern is of a type for independently driving the respective devices. However, this may be formed such that a matrix driving can be effected. In this case, the wiring electrode is formed, for example, as follows: The electrodes 6 of the VCSELs on the epitaxial layer side are connected with respect to a row in one direction of the two-dimensional array, and the wiring is drawn out to an electrode pad array outside of the VCSEL region 20. On the side of the substrate 1, an electrode separation is carried out similarly to the epitaxial layer side (for example, etching is performed from the substrate 1 down to the active layer 3 in a lattice pattern, and thus-formed grooves are buried with insulating material to flatten the surface). The thus-separated electrodes 7 on the VCSEL substrate side are connected with respect to a column in the other direction of the two-dimensional array, and the wiring is drawn out to an electrode pad array outside of the VCSEL region 20 (see FIG. 16 which will be explained later).

When the above structure is put in a shallow box-shaped package, the wiring substrate 30 is die-bonded on an inner bottom face of the package and the respective electrodes or electrode pads 7 and 12 are connected to pins provided on side walls of the package by bonding wires 14. This package is mounted to a print-circuit board, for example.

In this embodiment, no alignment precision is required when the VCSEL substrate 21 and the wiring substrate 30 are bonded. Therefore, its yield and productivity can be increased. Further, since there is no bonding and the like near the VCSEL, characteristics of the VCSEL cannot be damaged or lowered.

Second Embodiment

A second embodiment will be described with reference to FIG. 10 in which the same funtional portions as those in FIG. 7 are designated by the same reference numerals as those in FIG. 7.

Figure 10:
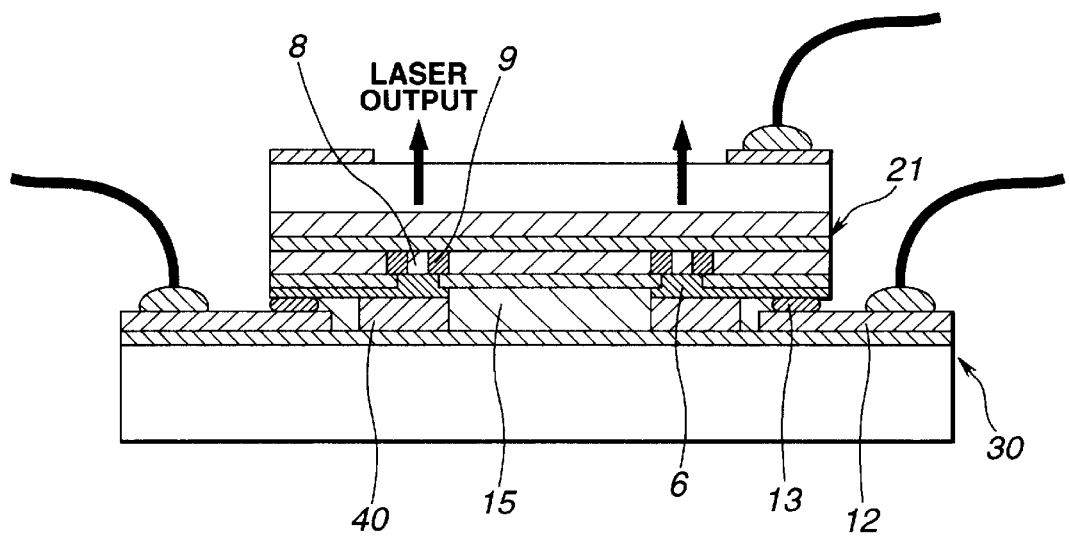
FIG. 10 is a cross-sectional view illustrating the structure of a VCSEL array of a second embodiment according to the present invention.

The second embodiment of the present invention is directed to a configuration wherein a thermal radiating structure is provided under each light radiation region 8 as shown in FIG. 10 to improve thermal radiation characteristics of VCSEL. Other structures, such as the VCSEL structure and wiring electrode structure, are the same as those of the first embodiment.

A dot portion 40 of metal, such as Au, is formed by the plating or the like at places of the wiring substrate 30 corresponding to the respective VCSELs. The size of the dot portion 40 is set such that its diameter is about 100 $\mu$m and its height is about the sum of heights of the electrode pattern 12 and solder 13 on the wiring substrate 30. These Au dots 40 are electrically independent from each other and have nothing to do with the wiring. The Au dot 40 is pressed against the electrode 6 of VCSEL when the VCSEL substrate 21 and the wiring substrate 30 are pressed and bonded to each other. Thus, a good thermal conduction can be established between the electrode 6 and the Au dot 40. Accordingly, oscillation characteristics of the VCSEL can be improved. Specifically, its threshold current can be decreased, its maximum power can be increased, and thermal crosstalk between adjacent VCSELs can be reduced.

In pressing the Au dot 40 against the electrode 6, pressure contact thereat can be readily attained and the strength of the contact can be increased when an uneven structure of about a 10-$\mu$m pitch is formed on the surface of the dot 40. Further, ultrasonic waves or solder can be employed like the bonding between the electrode pads 6 and 12. Where there is a fear that the VCSEL might be injured, an annular recess with the diameter of the radiation region 8 may be formed at the center of the Au dot 40.

Examples of AlGaAs/GaAs series on the GaAs substrate are described in the first and second embodiments, but a choice of material series is not limited thereto. The present invention can also be applied to other materials, such as GaN series of blue radiation and GaInNAs of a long-wavelength material on the GaAs substrate.

Third Embodiment

Figure 11:
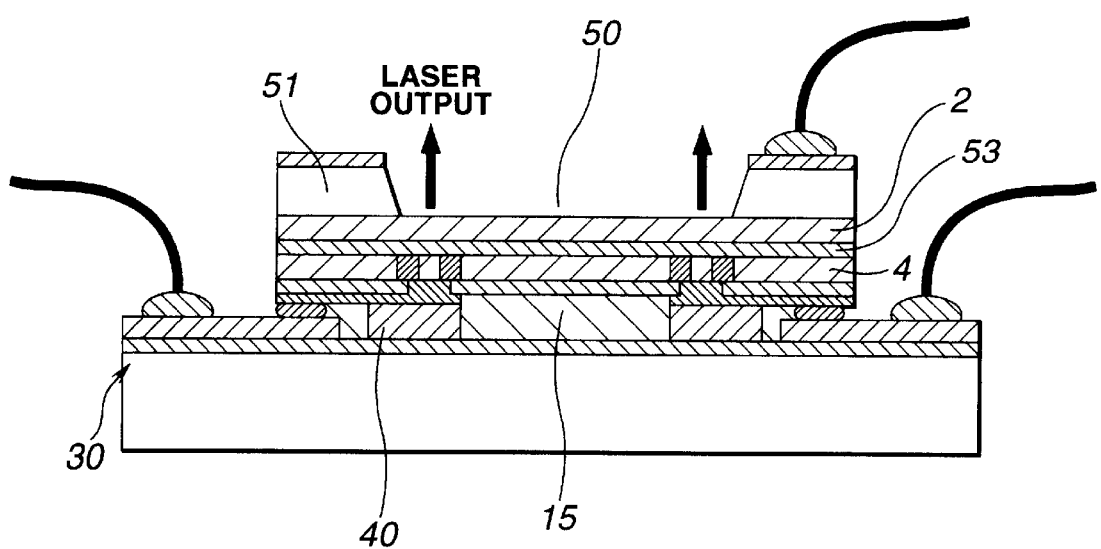
FIG. 11 is a cross-sectional view illustrating the structure of a VCSEL array of a third embodiment according to the present invention.

A third embodiment of the present invention is directed to a configuration wherein a portion of a VCSEL substrate 51 in a VCSEL array region is removed by etching as illustrated in FIG. 11 to take out laser light therethrough. In FIG. 11, the same functional portions as those in FIG. 7 are designated by the same reference numerals as those in FIG. 7.

When the oscillation wavelength of a VCSEL of GaAs series is below 0.9 $\mu$m, the GaAs substrate 51 becomes absorptive to such light. Therefore, the substrate 51 needs to be removed when light is taken out from the VCSEL substrate side. In the third embodiment, DBR mirrors 2 and 4 are respectively composed of AlAs/AlGaAs multi-layers like the first and second embodiments. The third embodiment, however, differs therefrom in that an active layer 53 is formed of a multiple quantum well layer of GaAs/AlGaAs series.

In this embodiment, the thermal radiation characteristic is improved by the Au dot 40 like the second embodiment. The Au dot 40 also acts as a reinforcing plate compensating for the removal of the substrate 51. Further, the spacing between the VCSEL substrate 51 and the wiring substrate 30 is filled with the resin 15. The removal of a portion of the substrate 51 in the VCSEL array region (this removed region is denoted by a numeral 50 in FIG. 11) is executed using a mixture of hydrogen peroxide water and ammonia. A selective etching of GaAs and AlAs is possible by using this mixture and, therefore, the etching can be readily stopped at the surface of the DBR mirror 2.

In this embodiment, the removal of the substrate is described for the GaAs series. This structure, however, can be likewise applied to a case of InP series where dielectric mirrors need to be formed. Specifically, the InP substrate can be selectively etched and removed using HCl or the like with InGaAsP (an InGaAsP etching stop layer is formed on the InP substrate) being left, and the dielectric mirror is formed in a removed portion by sputtering or the like.

In this embodiment, a structure can be achieved independently from material of VCSEL and oscillation wavelength.

Fourth Embodiment

A fourth embodiment will be described with reference to FIG. 12 in which the same funtional portions as those in FIG. 7 are also designated by the same reference numerals as those in FIG. 7.

Figure 12:
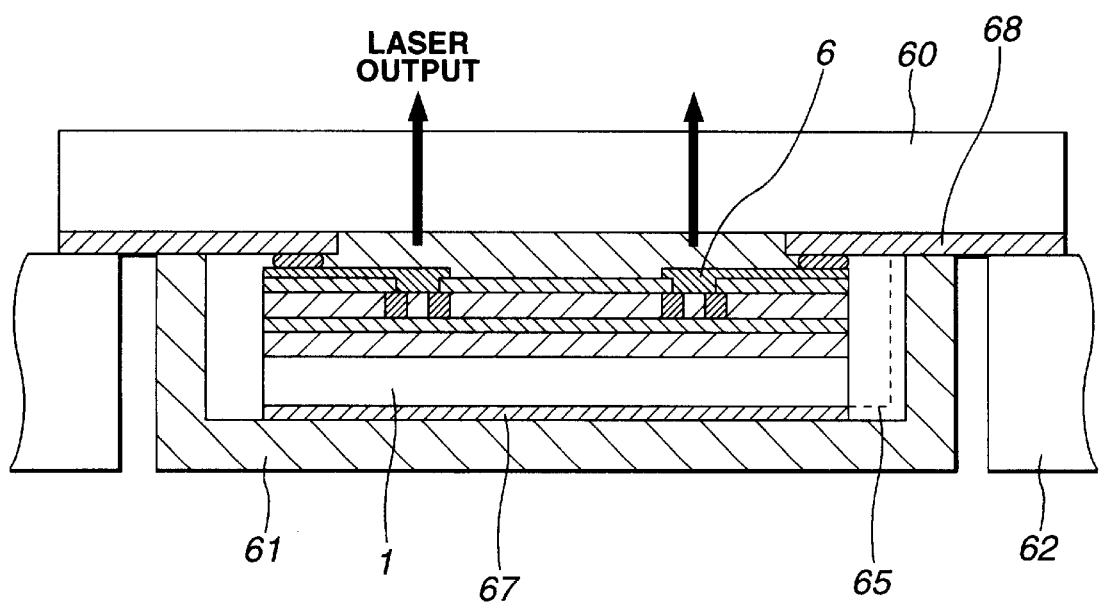
FIG. 12 is a cross-sectional view illustrating the structure of a VCSEL array module of a fourth embodiment according to the present invention.
Figure 17:
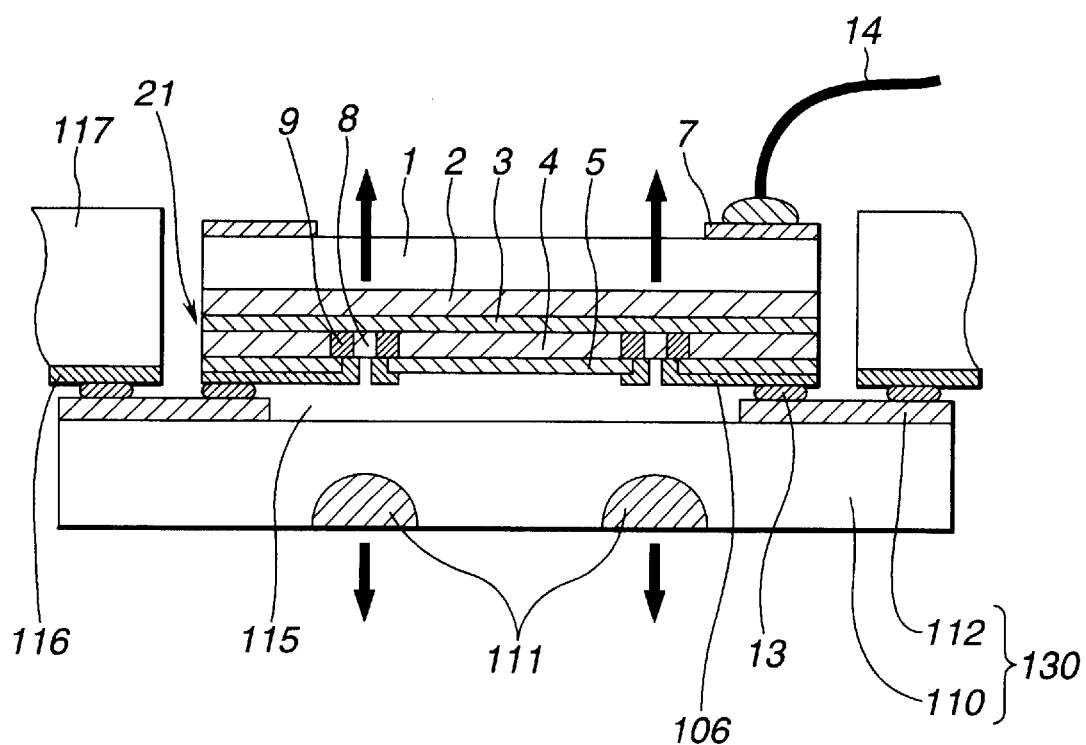
FIG. 17 is a cross-sectional view illustrating the structure of a VCSEL array of an eighth embodiment according to the present invention.

The fourth embodiment of the present invention is directed to a configuration wherein a wiring substrate 60 is composed of material transparent to an oscillation wavelength of VCSEL as illustrated in FIG. 12. In the material series described in the first embodiment, light can be transmitted through the wiring substrate even when this substrate is composed of an Si substrate. However, there is a little absorption and therefore, it is preferable to use a fully transparent material, such as glass, as the wiring substrate. In order to enhance a heat-sink effect, diamond or sapphire is more preferable. In such a VCSEL structure, a window needs to be formed in the electrode 6 as illustrated in FIG. 17 to take out laser light from the epitaxial layer side.

In this embodiment, the side of the VCSEL substrate 1 of the VCSEL array is bonded to, for example, a box-shaped package 61 as illustrated in FIG. 12. A compact packaging is thus achieved. The package 61 is formed of ceramic or the like. An electrode 67 on the VCSEL substrate 1 only needs to be connected to an appropriate wiring 68 on the wiring substrate 60 through a wiring (denoted by a dotted line 65) provided on an inner side of the package 61. The wiring electrode 6 from the VCSEL array is electrically connected to another substrate 62, such as an electronic-device substrate of Si or a print-circuit board with an electric circuit formed thereon, through the wiring substrate 60.

The VCSEL array and driver therefor can be integrally packaged in a compact form by the above mounting method. The above structure can also be employed as an actual mounting configuration for a so-called inter-board optical interconnection wherein connections between print-circuit boards with high-performance electronic circuits including processors and the like are made using light.

Fifth Embodiment

Figure 13:
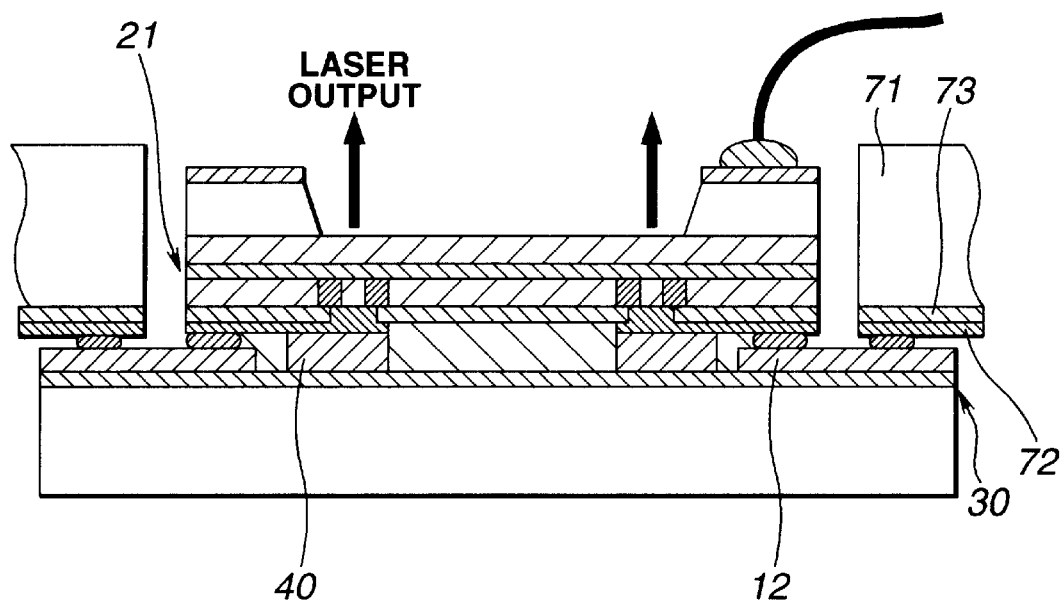
FIG. 13 is a cross-sectional view illustrating the structure of a VCSEL array of a fifth embodiment according to the present invention.

A fifth embodiment of the present invention is directed to a configuration of a type of the first to third embodiments, wherein the wiring from the wiring substrate 30 to another portion is accomplished by the electric connection to another substrate 71, but not by wire bonding as in the fourth embodiment. When the VCSEL array is contained in an IC package or the like, an electrode pad 72 corresponding to the electrode pad 12 on the wiring substrate 30 and a wiring connected to a pin of the package are formed on the Si substrate 71. The substrate 71 has a thermally-oxidized surface layer 73, and a portion of the substrate 71 corresponding to the VCSEL substrate 21 is removed as illustrated in FIG. 13. Electric connections between the electrode pads 12 and 72 and between the wiring to the package's pin and this pin are established by the solder or the like, similarly to the above embodiments. Herein, the wiring substrate 30 is bonded to the inner bottom surface of a box-like package, and the Si substrate 71 with the thermally-oxidized layer 73 is put over this box-like package. The wire bonding process can be thus omitted, so that its productivity can be improved and cost can be reduced. In this embodiment, the structure is put in the package. However, the structure may be mounted to the print-circuit board with the electric circuit or the like, similarly to the fourth embodiment, in place of the wiring substrate 71.

Sixth Embodiment

Figure 14:
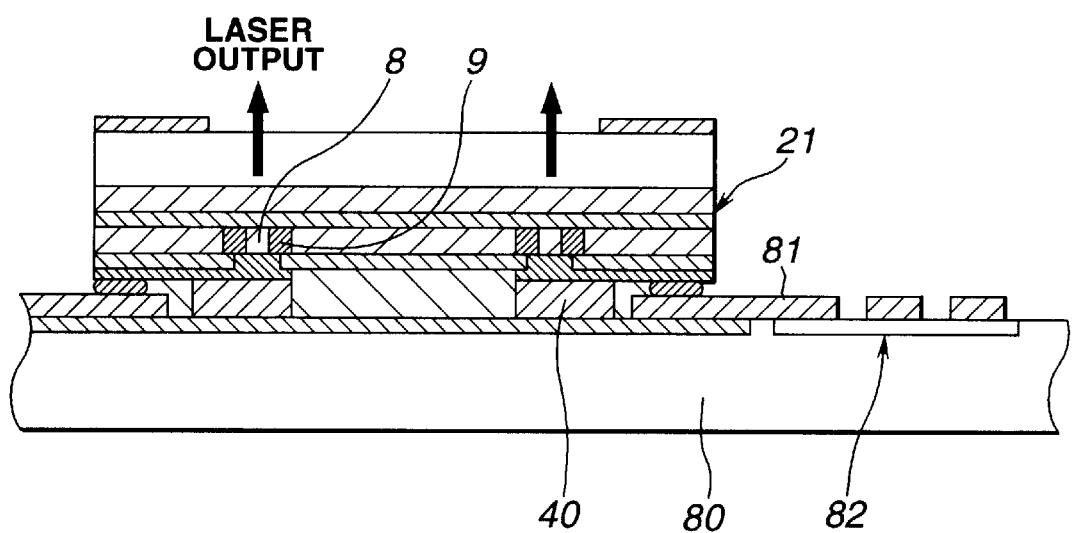
FIG. 14 is a cross-sectional view illustrating the structure of a VCSEL array module with an integrated electronic device of a sixth embodiment according to the present invention.

A sixth embodiment of the present invention is directed to a configuration wherein an electronic device is formed on a wiring substrate 80 as illustrated in FIG. 14. In the wiring substrate 80 similar to that of the first embodiment, a wiring electrode 81 (which corresponds to the electrode pattern 12 in FIG. 7) is directly connected to a collector electrode of a transistor 82 for driving VCSEL, or connected to its emitter electrode via a resistance formed by thinning the wiring. Other wiring electrodes are also formed to connect other electrodes to other electronic devices, power sources and the like on the wiring substrate 80. The connection manner of the electrodes of the transistor 82 is determined depending on the VCSEL's connection structure, i.e., anode-common or cathode-common structure.

When devices for driving the VCSELs are thus formed on the wiring substrate 80, an optimal light source apparatus can be achieved for a small-sized optical interconnections or the like.

Seventh Embodiment

A seventh embodiment will be described with reference to FIG. 15 in which the same funtional portions as those in FIG. 7 are also designated by the same reference numerals as those in FIG. 7.

Figure 15:
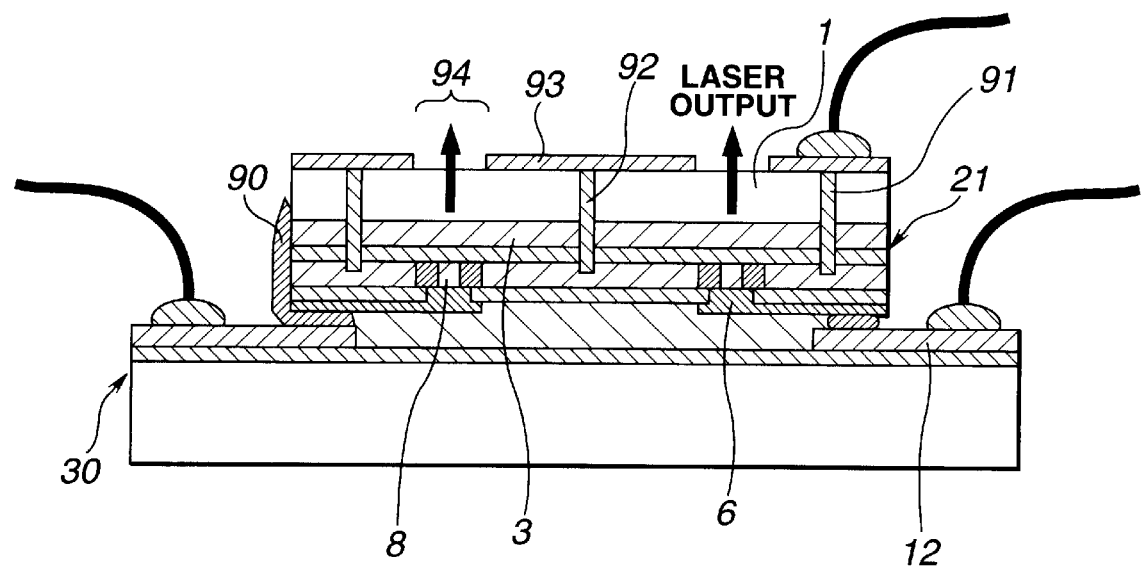
FIG. 15 is a cross-sectional view illustrating the structure of a VCSEL array of a seventh embodiment according to the present invention.

The seventh embodiment of the present invention is directed to a structure for solving the problem that characteristics of VCSEL may be injured due to a short on the end face of the VCSEL substrate 21 caused by undesired expansion of solder or adhesive 90 as illustrated in FIG. 15 when the electrode pads 6 and 12 are bonded. This problem is solved by the structure wherein a groove 91 is formed from the substrate 1 down toward the epitaxial face after the VCSEL substrate 21 and the wiring substrate 30 are bonded. The groove 91 only needs to extend down below the undoped active layer 3 at which the polarity changes. The adverse influence of the end face of the VCSEL substrate 21 appears particularly when the active layer 3 and its neighboring layers continuously extend over the entire substrate as illustrated in FIG. 1 of the prior art device, because current leaks through those layers.

Figure 16:
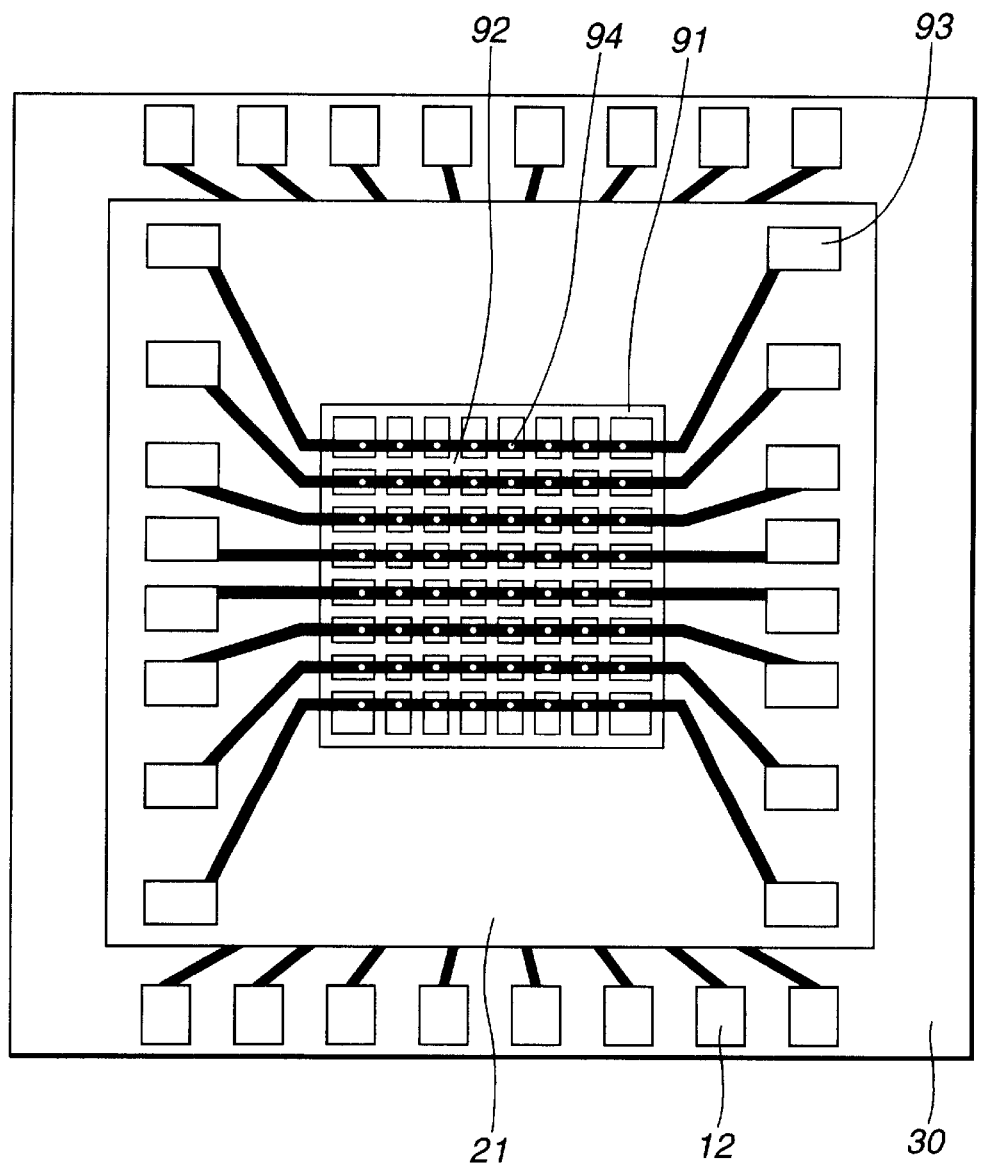
FIG. 16 is a plan view illustrating the structure of the seventh embodiment.

Further, as illustrated in FIG. 16, similar grooves 91 may be formed between the respective VCSELs in a lattice pattern when crosstalks of current, heat and light between adjacent VCSELs are not negligible. In this case, a wiring electrode 93 on the side of the substrate 1 is formed after the etched grooves 91 are buried with polyimide 92 or the like to smooth uneven steps. Windows 94 are formed in the wiring electrode 93 to transmit therethrough light from the VCSELs.

The structure illustrated in FIG. 16 can drive the VCSELs in a matrix-wiring manner. This structure is especially effective in the case of a large number of arrayed devices. Herein, the wiring electrode 93 on the epitaxial layer side is not like the fully-independent driving type as illustrated in FIG. 8. This wiring electrode 93 connects the VCSELs arranged in a column direction perpendicular to a row direction in which the electrode pattern 93 extends as illustrated in FIG. 16. Accordingly, the wiring electrode pads 12 on the wiring substrate 30 are provided only on portions on opposite sides with respect to the column direction as illustrated in FIG. 16.

The wiring electrode of the above embodiments can also be naturally employed in the seventh embodiment. In this case, the electrode of the VCSEL on the substrate side only needs to be formed over the entire substrate 1 with windows being formed at radiation portions, since the wiring electrode 6 on the epitaxial layer side is formed in the fully-independent driving type as illustrated in FIG. 8.

In the first to seventh embodiments, the 8×8 two-dimensional VCSEL array is described, but the number of VCSELs is not limited thereto. Even a single VCSEL can be adopted. Further, the surface emitting laser array is described, herein, but an array of end-facet emitting lasers can also be adopted. In this case, since the end-facet emitting laser emits light from its end facet in parallel to its substrate surface, lasers are typically arranged in a one-dimensional form. An electrode on the substrate side is formed on the bottom of the substrate as a common electrode, electrodes on its epitaxial layer side extend in a stripe form along the light emerging direction, and electrode pads are drawn out from these stripe-shaped electrodes, respectively. On a wiring substrate side, electrode pads are formed corresponding to the above electrode pads drawn from the stripe-shaped electrodes, and these electrode pads on the wiring substrate are drawn to electrode pads formed on an edge portion of the wiring substrate, for example.

Further, a surface-type light receiving device can be likewise fabricated and mounted, and thus a light transmitting and receiving (transceiver) unit with a laser array and a photodetector array formed on a common substrate can be provided.

Eighth Embodiment

An eighth embodiment will be described with reference to FIG. 17 in which the same funtional portions as those in FIG. 7 are also designated by the same reference numerals as those in FIG. 7.

The eighth embodiment of the present invention is directed to a structure wherein light is emitted from a wiring substrate side as well as the laser substrate side.

Figure 18:
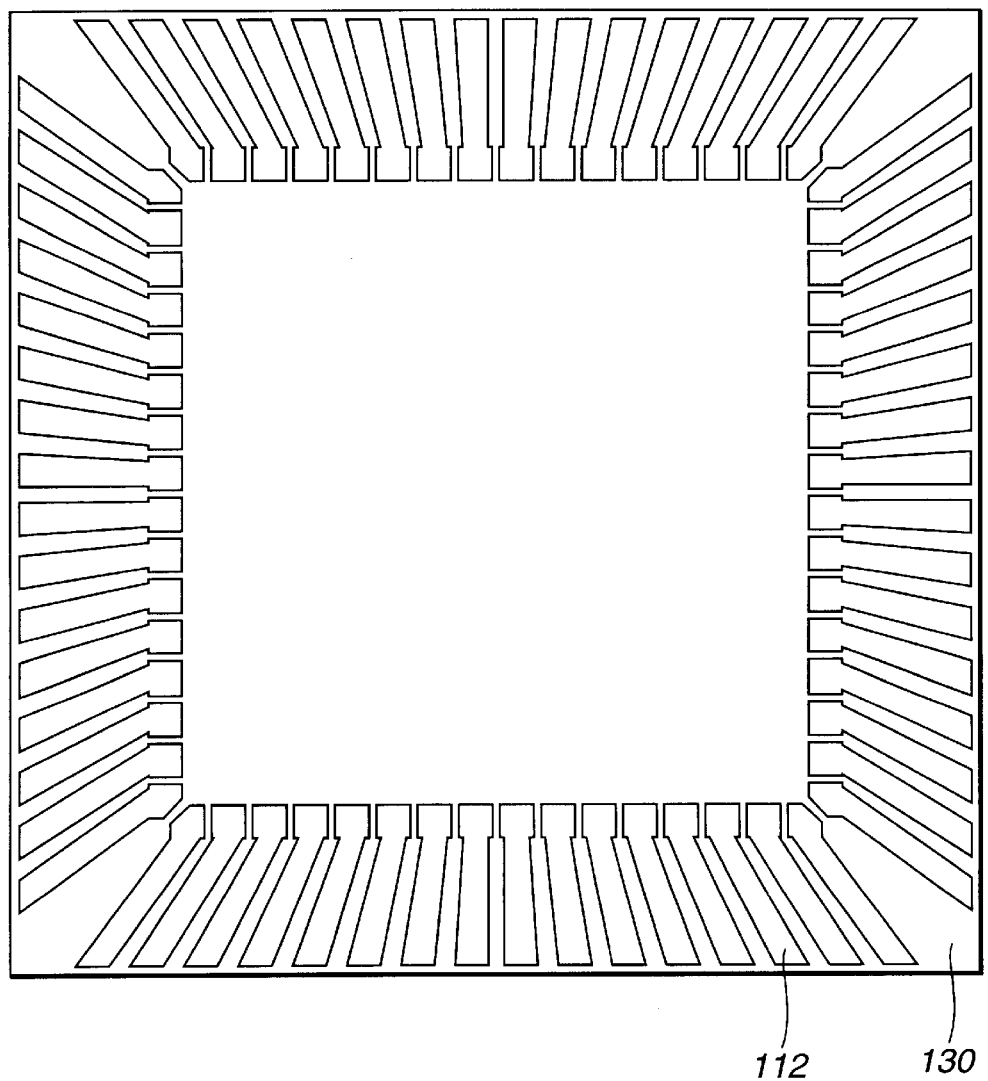
FIG. 18 is a plan view illustrating the structure of another wiring substrate according to the present invention, to which a VCSEL-array is to be bonded.

In this embodiment, a window of a diameter of 5 $\mu$m is formed at the center of an electrode 106 of a VCSEL portion, so that light can be taken out from the epitaxial layer side. A sub-mount or wiring substrate 130 for mounting the VCSEL substrate thereto has an electrode pattern 112 as illustrated in FIG. 18. The wiring electrode 112 is formed corresponding to the electrode pad 106 formed at each radiation region of the VCSEL. The electrode pad 106 has the same pattern as in FIG. 8. The electrode pattern 112 is essentially the same as that of FIG. 9. As illustrated in FIG. 17, the sub-mount 130 is composed of a glass substrate 110 in which an array of plane microlenses 111 are arranged by forming refractive-index distributions diffusion. The wiring electrode 112 is formed of Cu/Ni/Au by plating on the bottom surface of the glass substrate 110.

A space 115 formed by bonding the electrodes 106 and 112 may be left as it is, or filled with resin or the like which either scatters laser light or absorbs very little of it. Antireflection coating may be provided on opposite surfaces of the glass substrate 110 to reduce the adverse influence of returning light to the VCSEL.

In this embodiment, the alignment between the VCSEL substrate 21 and the wiring substrate 130 can be precisely achieved by monitoring laser light through the plane microlenses 111 while lasing the VCSELs. The plane microlenses 111 may be omitted, or fabricated while lasing the VCSELs after mounting the wiring substrate 130 to the VCSEL substrate 21. Further, grooves may be formed by etching after mounting the wiring substrate 130 to the VCSEL substrate 21, and thereafter ball lenses may be put into the grooves using adhesive or the like.

The wiring from the VCSEL array can be directly electrically connected to a wiring electrode 116 on another substrate 117, such as an Si substrate with electronic devices or a print-circuit board.

The VCSEL array, collimator lenses for laser light and drivers for these VCSELs can be thus packaged in a compact integrated form. The above structure can also be employed as an actual mounting configuration for a so-called interboard optical interconnection wherein a connection between print-circuit boards with high-performance electronic circuits including processors and the like is executed using light.

Where the VCSEL array is contained in an IC package or the like, the size of the wiring substrate 130 is made accordant with a cavity size of the package and the wiring 112 of the wiring substrate 130 is formed so as to extend to pins of the package. The wiring 112 of the wiring substrate is electrically connected to the pin and therefore, the complicated work of wire-bonding the wiring electrode 112 can be omitted. When the laser substrate 21 is die-bonded to an inner bottom of the IC package, laser light can be taken only from the side of the wiring substrate 130 (see FIG. 12 in this connection).

Also in this embodiment, yield and productivity can be improved since the alignment between the VCSEL substrate 21 and the wiring substrate 130 can be readily achieved. Further, since there is no wire-bonding work and the like near the VCSEL, characteristics of the VCSEL cannot be damaged or lowered. Moreover, an example of AlGaAs/GaAs series on the GAAs substrate is desribed in the eighth embodiment, but a choice of material series is not limited thereto. Other materials, such as GaN series of blue radiation and GaInNAs of a long-wavelength material on the GaAs substrate can be used as described above.

Ninth Embodiment

Figure 19:
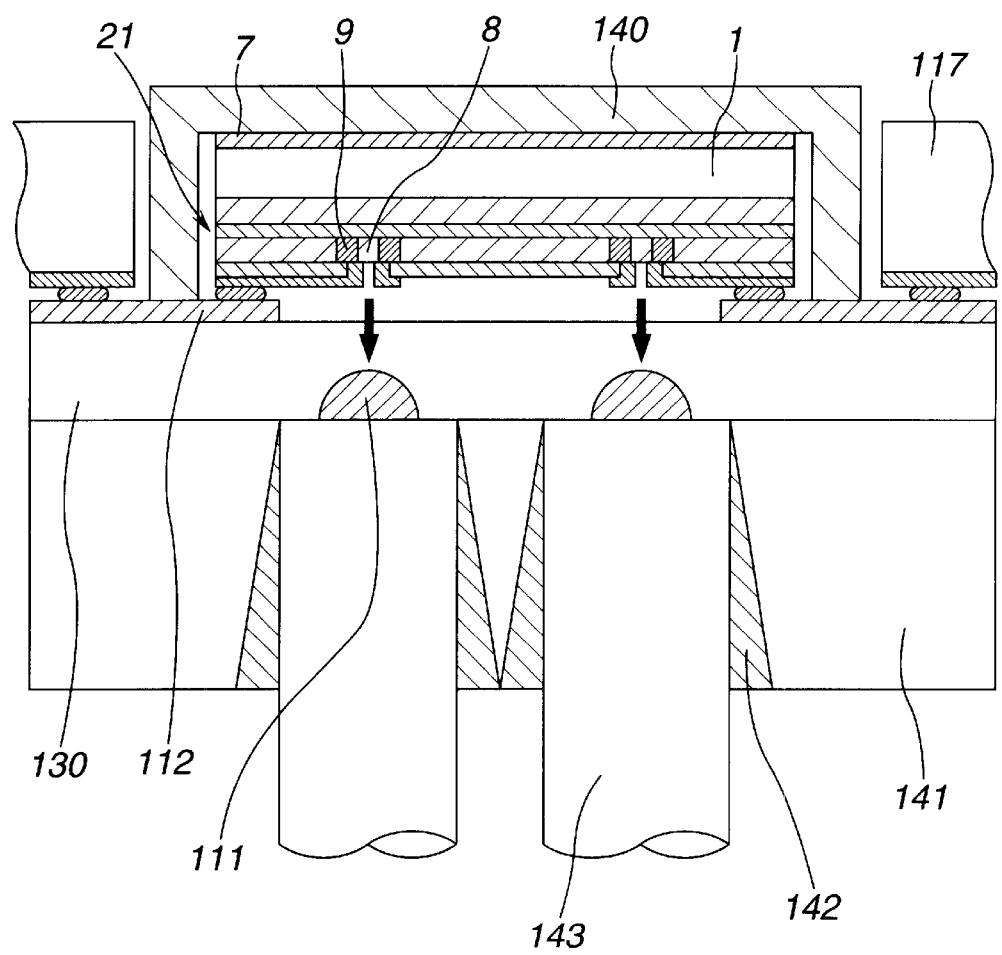
FIG. 19 is a cross-sectional view illustrating the structure of a VCSEL array module of a ninth embodiment according to the present invention.

A ninth embodiment of the present invention is directed to a configuration wherein an optical fiber 143 for guiding laser light from VCSEL is also integrated as illustrated in FIG. 19. Other structures, such as the VCSEL structure and wiring substrate 130, are the same as those of the eighth embodiment, with an exception that a heat sink 140 of a thermal radiating structure is provided on the side of the laser substrate 21. The sink 140 is ordinally formed of ceramic, such as $Al_2O_3$ or AlN. The box-shaped heat sink 140 covers the laser substrate 21 as illustrated in FIG. 19. The electrode 7 on the substrate side is electrically connected to the corresponding electrode 112 on the wiring substrate 130 through a wiring formed on an inner wall of the heat sink 140 (see the description of FIG. 12 in this connection).

The optical fiber 143 is mounted as follows: Another substrate 141 (also referred to, herein, as fiber supporting substrate 141 and Si substrate 141) is bonded to the wiring substrate 130 as illustrated in FIG. 19, and a guide hole 142 is formed in the substrate 141 into which the fiber 143 is inserted. Thus, the fiber 143 can be readily mounted in an appropriate position. A process of forming the guide hole 142 will be described with reference to FIGS. 20A to 20C.

Figure 20A:
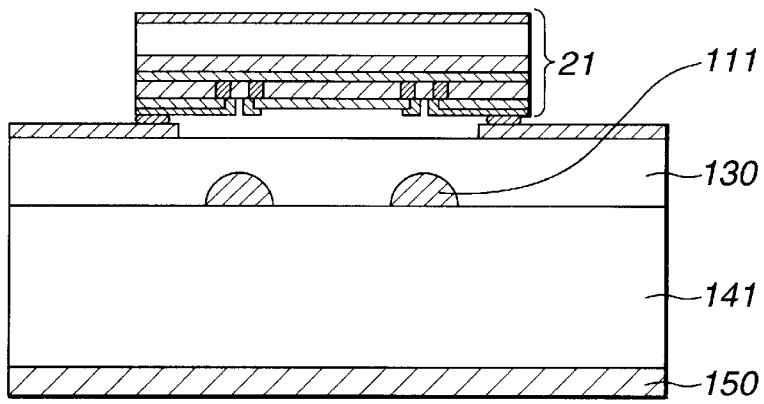
FIGS. 20A through 20C are respectively cross-sectional views illustrating fabrication steps of the ninth embodiment.

An Si wafer having a thickness of 500 $\mu$m is used as the fiber supporting substrate 141, for example. In FIG. 20A, the substrate 21 of the VCSEL array is mounted to the wiring substrate 130 with microlenses 111 by the method of the eighth embodiment, and the Si substrate 141 is bonded to the wiring substrate 130 using an anodic bonding method or the like. A resist 150 is then deposited on the Si substrate 141. In the anodic bonding method, a cathode and an anode are applied to the glass of the wiring substrate 130 and the Si substrate 141, respectively, and a voltage is applied across these substrates 130 and 141. An adhesive of polyimide series or epoxy series may be used in this bonding method.

Figure 20B:
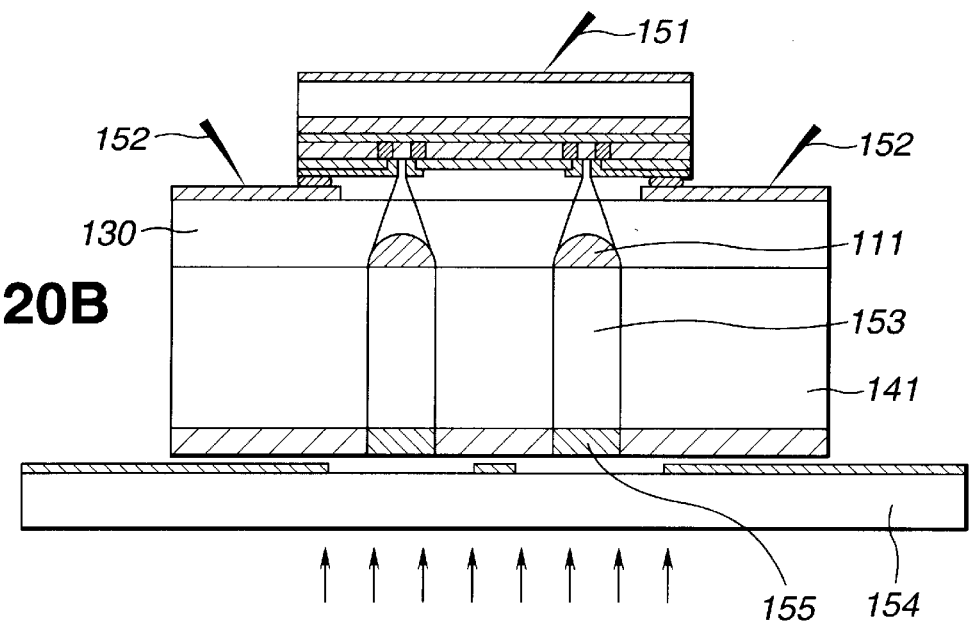

In FIG. 20B, a patterning is performed using a photomask 154 to form fiber guiding holes in accordance with positions of the VCSELs. Herein, current is injected into the VCSEL using probes 151 and 152, and the alignment is executed between radiated light 153 reaching the resist 150 through the microlens 111 and an opening 155 (its size is larger than a spot diameter of the light 153) while monitoring it by a CCD. A precise patterning can be thus effected readily.

Figure 20C:
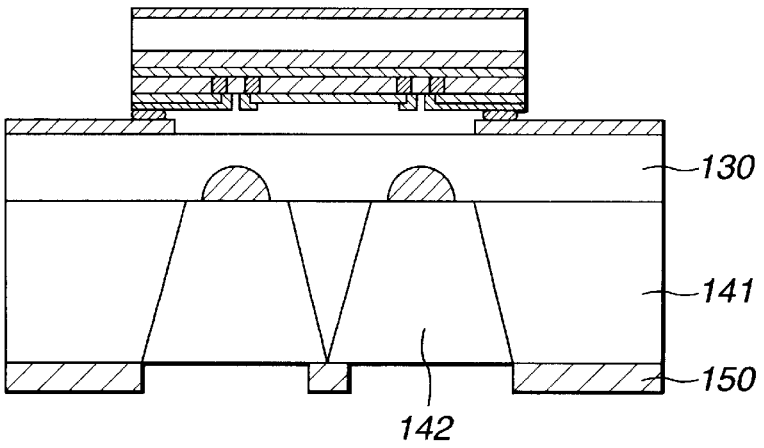

In FIG. 20C, etching of about 400 $\mu$m in depth is performed using a reactive ion beam etching (RIBE). Herein, the etching is carried out using the resist 150 partly exposed to light transmitted through the photomask 154. The guiding hole 142 is thus formed by a selective wet etching between Si 141 and glass 130, using KOH.

The optical fiber 143 is then inserted into the thus-formed guide hole 142. An end face of the fiber 143 is preferably made antireflective. A highly-effective optical coupling can be readily obtained by fixing the fiber 143 using the epoxy or the like. Thus, productivity can be improved and cost can be decreased. In this embodiment, the laser is not damaged when the fiber 143 is inserted and hence, yield can be improved.

The microlens 111 is provided in this embodiment, but the lens 111 can be omitted when the optical fiber 143 is a multi-mode fiber. In this case, light can be sufficiently coupled to the multi-mode fiber even when the distance between the end of the fiber 143 and the emitting face of the VCSEL is about 100 $\mu$m. Therefore, the thickness of the glass substrate 130 can be set to about 100 $\mu$m.

Tenth Embodiment

Figure 21:
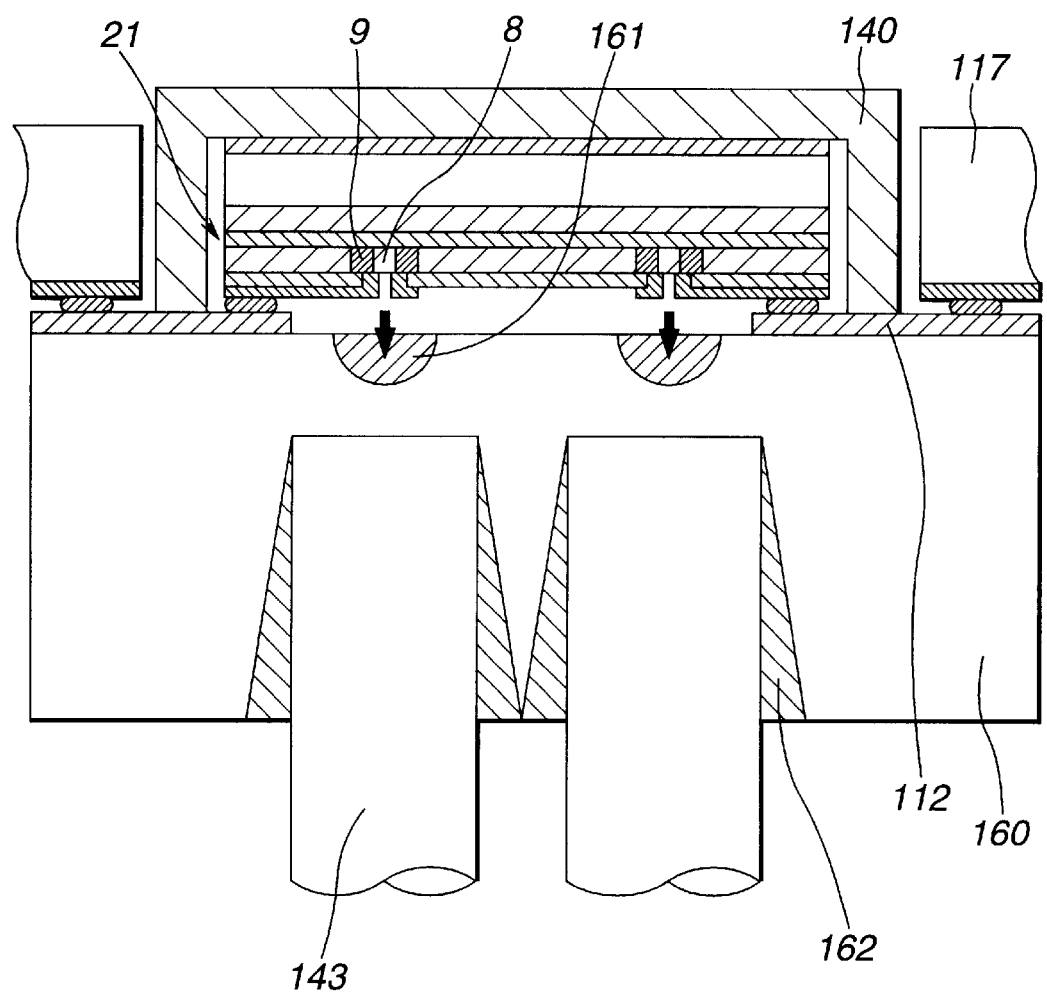
FIG. 21 is a cross-sectional view illustrating the structure of a VCSEL array module of a tenth embodiment according to the present invention.

A tenth embodiment of the present invention is directed to a configuration wherein a wiring glass substrate 160 is provided with both microlenses 161 and holes 162 for guiding the optical fibers 143 as illustrated in FIG. 21. Fabrication method and so forth are the same as those of the eighth and ninth embodiments. The tenth embodiment differs from the eighth and ninth embodiments in that the focal length of the microlens 161 is shortened since the microlens 161 is formed on the surface of the wiring glass substrate 160 facing the VCSEL array and the distance between the lens 161 and the VCSEL is thus shortened. The fiber guide hole 162 is formed by etching the glass substrate 160 with a wet etchant of hydrofluoric acid. Therefore, the etching should be performed and stopped carefully. In this embodiment, however, cost can be reduced since a process for bonding the glass substrate 160 to another substrate (see the substrate 141 in FIG. 19) is omitted.

Eleventh Embodiment

In the eighth to tenth embodiments, glass is mainly used as material of the wiring substrates 130 and 160 since the microlenses 111 and 161 should be formed in these substrates.

Figure 22:
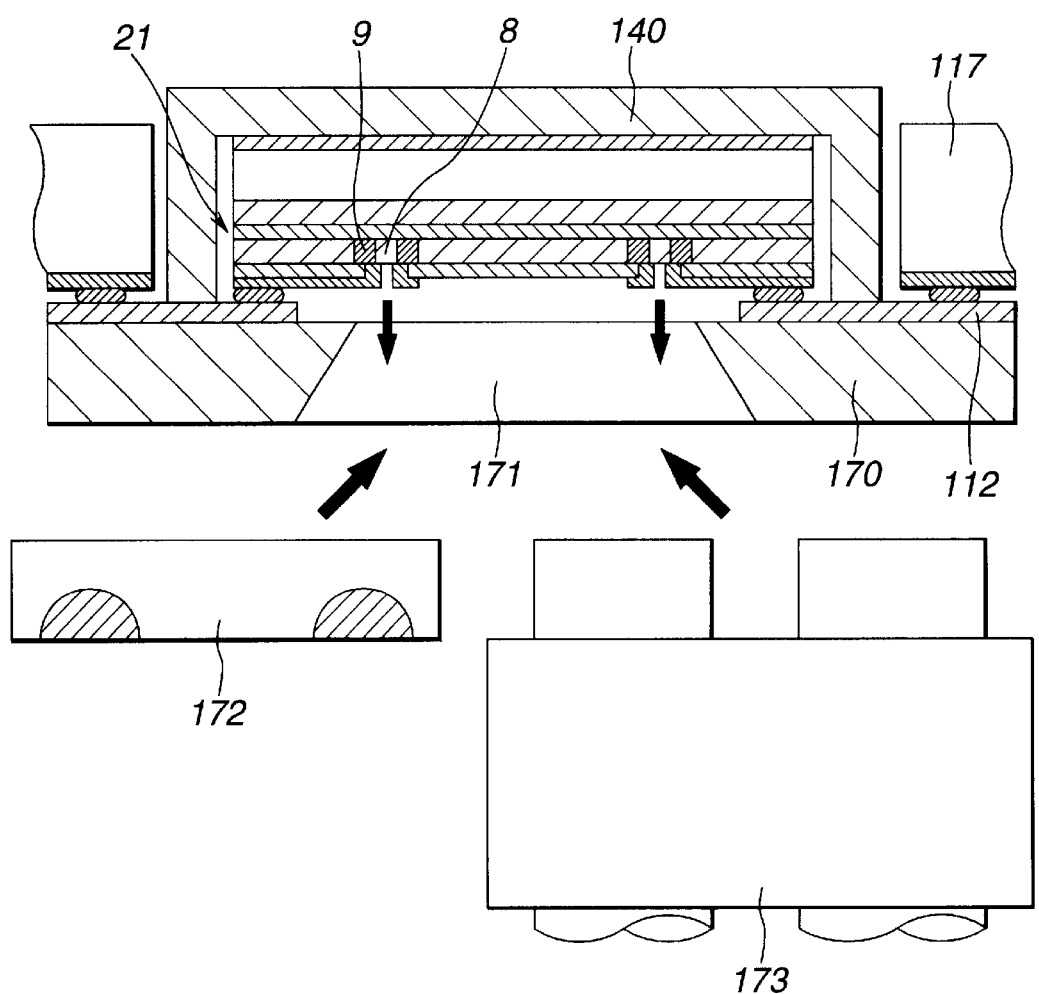
FIG. 22 is a cross-sectional view illustrating the structure of a VCSEL array module of an eleventh embodiment according to the present invention.

In an eleventh embodiment of the present invention, a hole 171 for taking out laser light is formed in a wiring substrate 170 by hole-etching only the area (approximately 1 mm-square in the case of the VCSEL type in the eighth embodiment) corresponding to the VCSEL array as illustrated in FIG. 22. Accordingly, there is no limitation on the type of material used for the wiring substrate 170.

For example, where an Si substrate is used as the wiring substrate 170 and the hole-etching of the substrate 170 is performed with KOH, light can be taken even when the laser wavelength is in an absorption range of Si. When contours of a microlens array 172 and an optical fiber tape 173 are so shaped as to be accordant with the hole portion 171 of the wiring substrate 170, these members 172 and 173 can be readily mounted by inserting them into the hole portion 171 and fixing them using an adhesive. Ball lenses can also be mounted in this manner. Other structures of the eleventh embodiment are the same as those of the ninth embodiment.

Twelfth Embodiment

Figure 23:
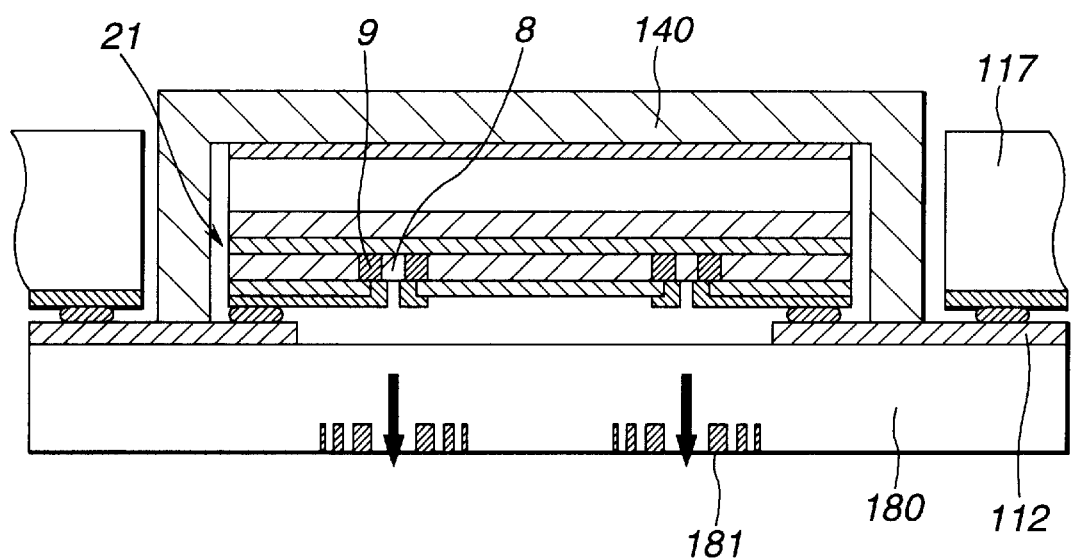
FIG. 23 is a cross-sectional view illustrating the structure of a VCSEL array module of a twelfth embodiment according to the present invention.

A twelfth embodiment of the present invention is directed to a configuration wherein a wiring substrate 180 is provided with Fresnel lenses 181, as illustrated in FIG. 23. This embodiment does not include the plane microlenses which are formed by diffusion. Other structures of the twelfth embodiment are the same as those of the eighth embodiment or the like.

A fabrication method of the Fresnel lens 181 can be performed by patterning using the self-alignment method while lasing VCSELs, similarly to the above-discussed formation of the fiber gude groove. Although the efficiency of the Fresnel lens 181 is lower than the plane microlens, cost can be reduced because the fabrication is easier and the Si substrate can also be used. For example, where the thickness of the wiring substrate 180 is 350 μm, i.e., the distance between the lens 181 and the VCSEL is about 360 μm, a three-zone Fresnel lens with ring grooves having a diameter of about 100 μm and a depth of about 0.5 μm will suffice to collect light, though the design should be slightly changed depending on the wavelength of laser light.

Also in the eighth to twelfth embodiments, the 8×8 two-dimensional VCSEL array is taken, but the number is not limited thereto. Even a single VCSEL can be adopted. Further, an array of end-facet emitting lasers can also be adopted. In this case, a mirror or the like for changing the path of laser light to a direction perpendicular to the substrate needs to be disposed near the end facet of the laser.

Further, a surface-type light receiving device can be likewise fabricated and mounted, and thus a light transmitting and receiving unit with a laser array and a photodetector array formed on a common substrate can be provided.

Furthermore, in the first to twelfth embodiments, electrodes corresponding to cathode and anode of the optical functional device such as the laser are respectively provided on top and bottom surfaces of the substrate of this device, but both electrodes can be provided on a common surface of the substrate. In this case, a groove is etched down to a layer lying below the active layer, and the electrode having a polarity of this layer is drawn out to the common surface by forming an insulating layer on the side wall of the etched groove and providing a wiring electrode on the insulating layer.

The VCSEL arrays described so far can be used, when used in spatial transmission, as a light source in inter-board optical interconnections, recordings by optical writing (i.e., laser beam printers), CD-ROM systems, magnetooptical disc systems and the like. Further, the VCSEL arrays can also be used, when coupled to optical fibers, as a light source apparatus in large-capacity optical parallel transmissions.

Thirteenth Embodiment

Following embodiments are directed to configurations which include both a surface emitting laser and a photodetector, respectively.

Figure 24:
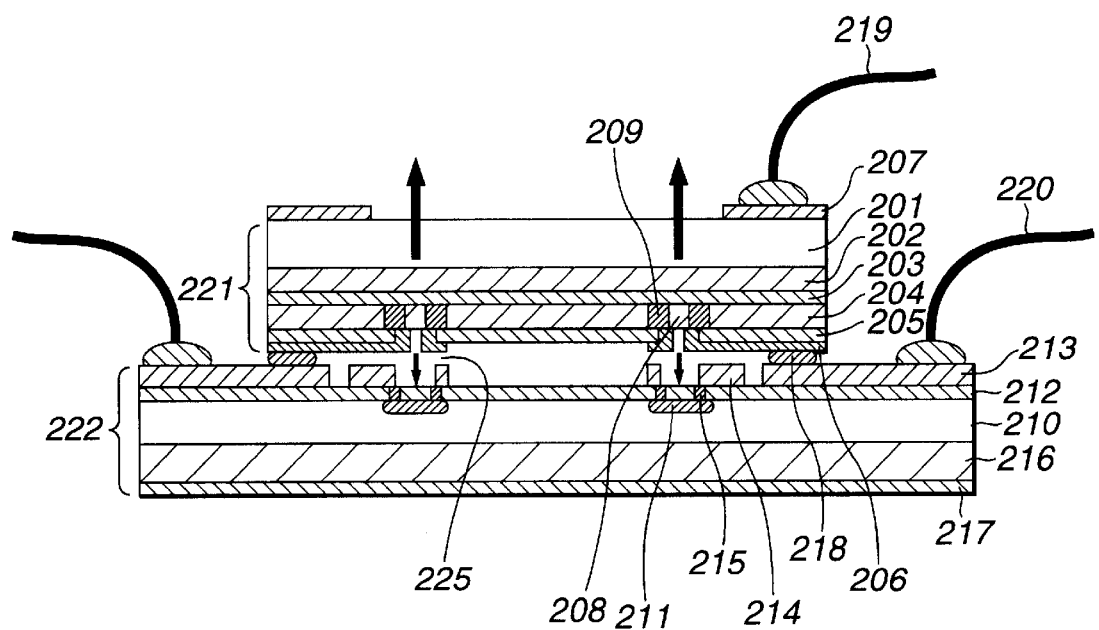
FIG. 24 is a cross-sectional view illustrating the structure of a VCSEL array module of a thirteenth embodiment according to the present invention.

A thirteenth embodiment of the present invention is directed to a configuration which includes an 8×8 two-dimensional VCSEL array on a laser substrate 221 and an 8×8 two-dimensional photodetector array on a wiring substrate 222 (also referred to, herein, as photodetector substrate 222). The structure of the VCSEL is substantially the same as that of the first embodiment. In FIG. 24, portions designated by reference numerals 201 to 205, 207 to 209 and 221 correspond to the portions designated by reference numerals 1 to 5, 7 to 9 and 21 in FIG. 7.

Figure 25:
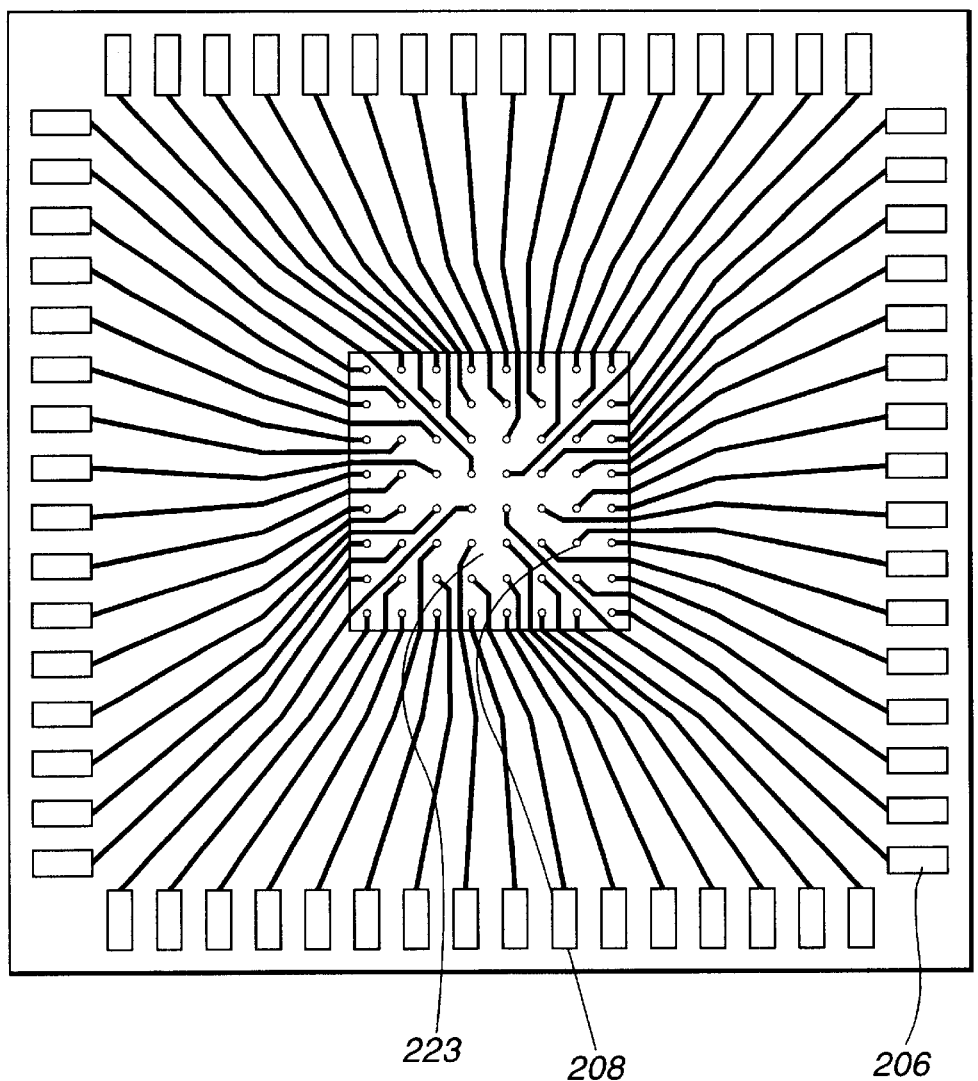
FIG. 25 is a plan view illustrating the structure of a VCSEL-array substrate of the thirteenth embodiment.

With respect to sizes of this embodiment, the radiation region 208 of the VCSEL has a diameter of 10 μm, the interval between the light radiation region 208 is 125 μm, the area of a VCSEL array region 223 (see FIG. 25) is accordingly 875 μm-square, and the area of the entire chip 221 is 3 mm-square. These sizes can be naturally changed freely. An electrode 206 of the VCSEL on the side of the epitaxial layer has a window with a diameter of 5 μm at its center, so that laser light can be taken from the side of the epitaxial layer as well. Light also can be taken from the substrate side of the VCSEL. The GaAs substrate 201 is trasparent to laser light at a 0.98-μm band.

Figure 26:
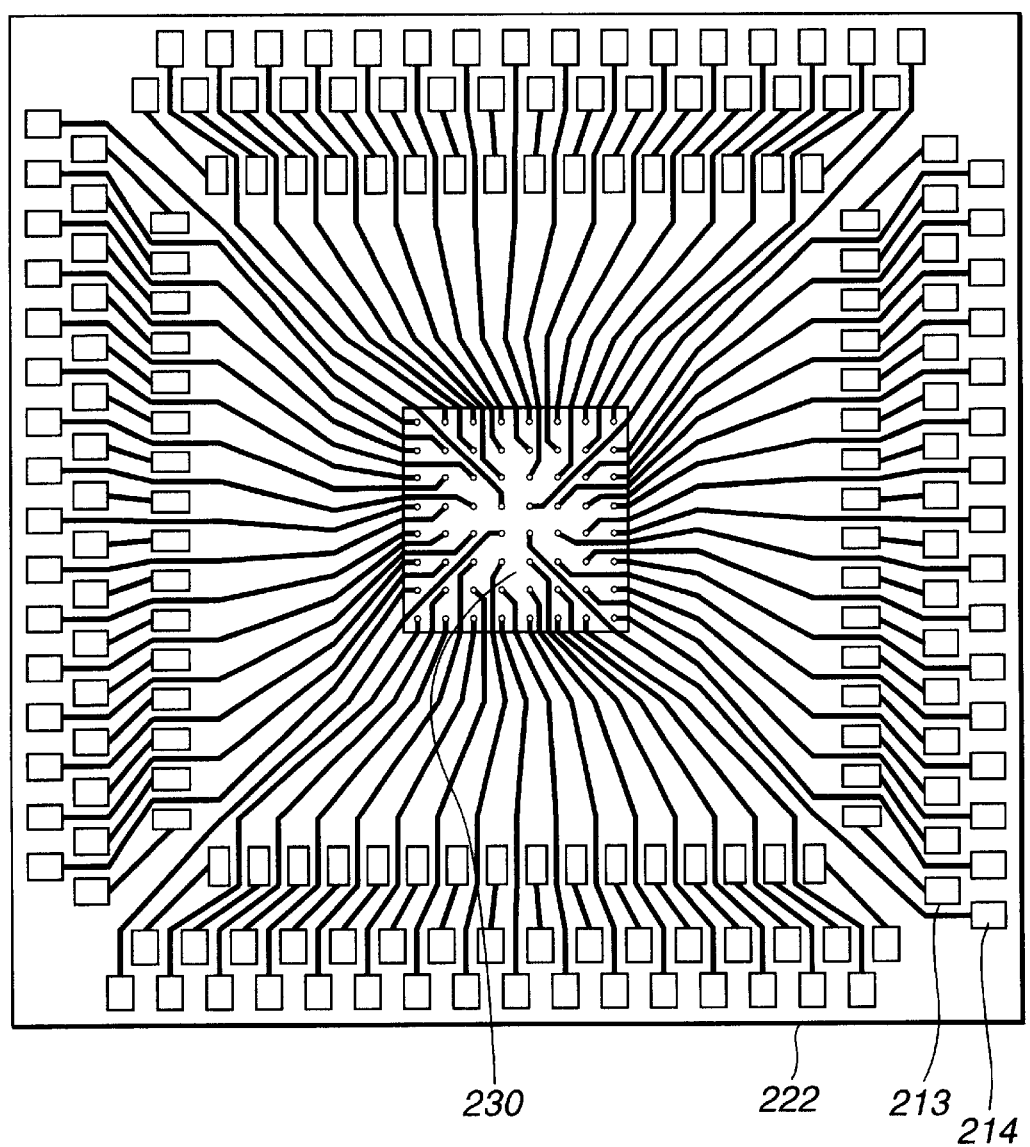
FIG. 26 is a plan view illustrating the structure of a photodetector and wiring substrate according to the present invention, to which a VCSEL-array of the thirteenth embodiment is to be bonded.

On the other hand, an electrode pattern illustrated in FIG. 26 is formed on a photodetector substrate (wiring substrate) 222 to which the VCSEL substrate 221 is mounted. In the electrode pattern, an electrode pad (an innermost electrode pad) is arranged corresponding to the electrode pad 206 on the side of the VCSEL radiation region 208 and this electrode pad is drawn outside to an outer electrode pad 213. On the substrate 222, pin-type photodetectors 230 are arrayed corresponding to the VCSELs, as illustrated in FIGS. 24 and 26. An electrode 214 of the photodetector 230 is so wired as to be drawn to an outermost electrode pad array on the substrate 222.

Those electrode patterns 213 and 214 are formed of Cu/Ni/Au by plating or the like. A solder 218 is formed on the electrode pad 213 by plating or the like. The VCSEL substrate 221 and the photodetector substrate 222 can be readily connected electrically and mechanically by aligning and heating them.

A spacing 225 formed by the connection of the electrodes 206 and 213 may be maintained as it is, or filled with resin or the like which either scatters laser light or absorbs very little of it. An antireflection coating may be provided on the photodetector substrate 222 to reduce adverse influence of returning light to the VCSEL.

In this embodiment, the wiring pattern is of a type for independently driving the respective devices similarly to the first embodiment. However, this may be modified such that a matrix driving can be effected, as discussed above.

The photodetector illustrated in FIG. 24 has the structure of an ordinary pin-PD (pin-photodiode). More specifically, an n$^+$-region 211 of a light receiving portion is formed on the p$^-$(π)-Si substrate 210. After an insulating layer 212 of SiO$_2$ or the like is deposited, the ring-shaped electrode and its wiring pattern 214 are formed as illustrated in FIGS. 24 and 26. An electrode contact with the n$^+$-region 211 is performed by forming a through-hole 215 in the insulating layer 212 and burying the through-hole 215 with material the electrode 214. On the other hand, a p$^+$-layer 216 is formed by an entire diffusion over the p-side surface of the substrate 210, a common p-side electrode 217 is entirely formed thereon. Where the laser power is too strong and the PD may be saturated, an absoptive material such as a thin metal film may be coated on the insulating layer 212 to reduce the power. As for reference numerals 219 and 220 in FIG. 24, they are bonding wires for the electrodes 207 and 213, respectively.

An actual mounting of the substrates 221 and 222 is carried out as follows. The p-side electrode 217 of the pin-PD is die-bonded to a package and connected to a ground common to the n-side electrode 207 of the laser substrate 221. Here, the laser has a cathode-common structure, the PD has an anode-common structure, and these are connected to the common ground. On the other hand, the anode of the laser is driven by a transistor through an LD controlling circuit, and an inverse voltage is applied to the PD through a resistor. Thus, photo-current of the PD is detected according to the output of the VCSEL.

Figure 30:
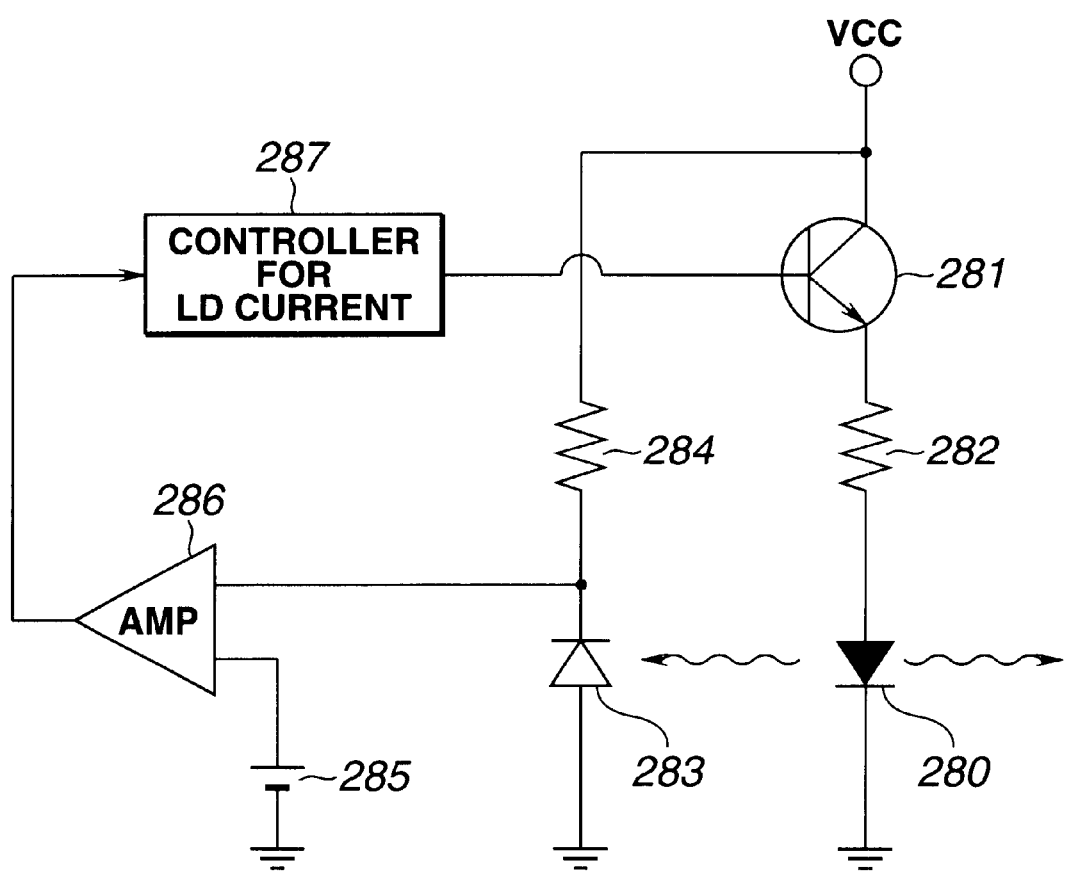
FIG. 30 is a schematic diagram of an APC circuit of a VCSEL array module in the case of a VCSEL having a cathode-common structure.

A schematic diagram of an APC circuit discussed above is illustrated in FIG. 30. Laser light from a VCSEL 280 is detected by a PD 283. Its voltage change is compared with a reference voltage 285 by an operational amplifier 286, and its result is fed back to a driving transistor 281 of the VCSEL such that a negative feedback can be performed by an LD current controlling circuit 287. This circuit system is directed to a case where the VCSEL has the cathode-common structure (i.e., the n-substrate 201 is used) and the PD has the anode-common structure (i.e., the p-substrate 210 is used) as discussed above. Where respective polarities differ from the above, a circuit only needs to be constructed based on the above circuit system. In FIG. 30, reference numerals 282 and 284 denote resistors.

In such a construction, the VCSEL array and the PD for monitoring the laser light can be packaged in a compact integrated form. Further, this construction can be made more compact than an optical system integrated by resin mold or the like, and the number of components can be further reduced. Its cost can be decreased accordingly. Since there is no need to pick up a portion of the output of the VCSEL by using a beam splitter or the like, a takeout efficiency of the laser power can be improved. Furthermore, since there is no wire-bonding work and the like near the VCSEL, characteristics of the VCSEL wiil not be damaged or lowered.

Fourteenth Embodiment

Figure 27:
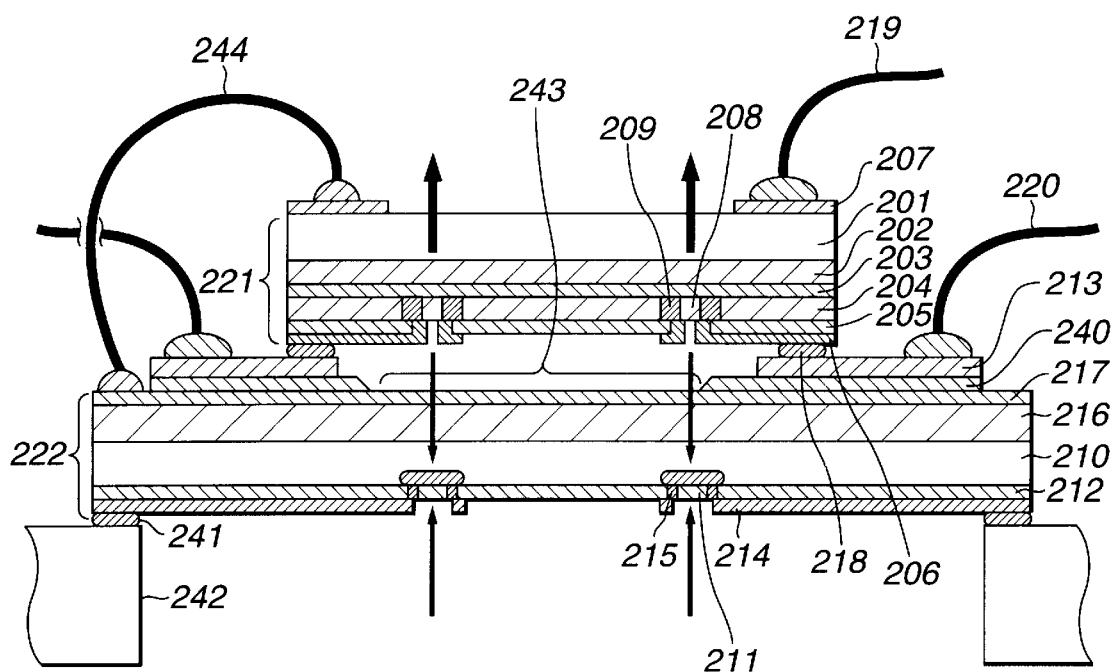
FIG. 27 is a cross-sectional view illustrating the structure of a VCSEL array module of a fourteenth embodiment according to the present invention.

A fourteenth embodiment of the present invention is directed to a configuration wherein photodetectors are integrated on a face of the wiring substrate 222 opposite to a face for receiving laser light of VCSEL, as illustrated in FIG. 27. In this structure, light from outside can also be received by the photodetector with high sensitivity.

In FIG. 27, the same funtional portions as those in FIG. 24 are designated by the same reference numerals as those in FIG. 24.

Laser substrate 221 and photodetector substrate (wiring substrate) 222 of the fourteenth embodiment are approximately the same as those of the thirteenth embodiment. The fourteenth embodiment is different from the thirteenth embodiment in that a window portion 243 is formed in the p-side electrode 217 of the photodetector such that light from the VCSEL can reach the photodetector and the wiring electrode 213 in contact with the VCSEL is formed after an insulating layer 240 is deposited on the p-side electrode 217. Laser light can transmit through the Si substrate since the oscillation wavelength of the VCSEL is 0.98 $\mu$m in this embodiment.

The installation is executed as follows: A wiring pattern is formed on a package 242 having a window in its light receiving region, similarly to the wiring pattern 213 for the VCSEL in FIG. 26. The n-side electrode 214 of the photo-detector is bonded to this wiring pattern through a solder plating 241. The p-side electrode 217 of the photodetector is electrically connected to the n-side electrode 207 of the VCSEL through a bonding wire 244 as illustrated in FIG. 27.

The above structure can be controlled by using external light in the following manner, for example. Under the APC condition, when external light enters the photodetector, the power of the VCSEL reaching the photodetector apparently rises for the photodetector. As a result, current injected into the VCSEL decreases and the output power of the VCSEL in turn decreases. Consequently, this VCSEL apparatus can act as an inverter for the external light input. Further, the external light can be incoherent light, laser light whose wavelength is different from that of the VCSEL, or the like, provided that it can be received by the pin-PD. Therefore, this VCSEL apparatus can also act as a pseudo-incoherent/coherent converter (VCSEL emits coherent light), or a wavelength converting device (VCSEL emits light at a wavelength different from that of light received by the PD).

Fifteenth Embodiment

Figure 28A:
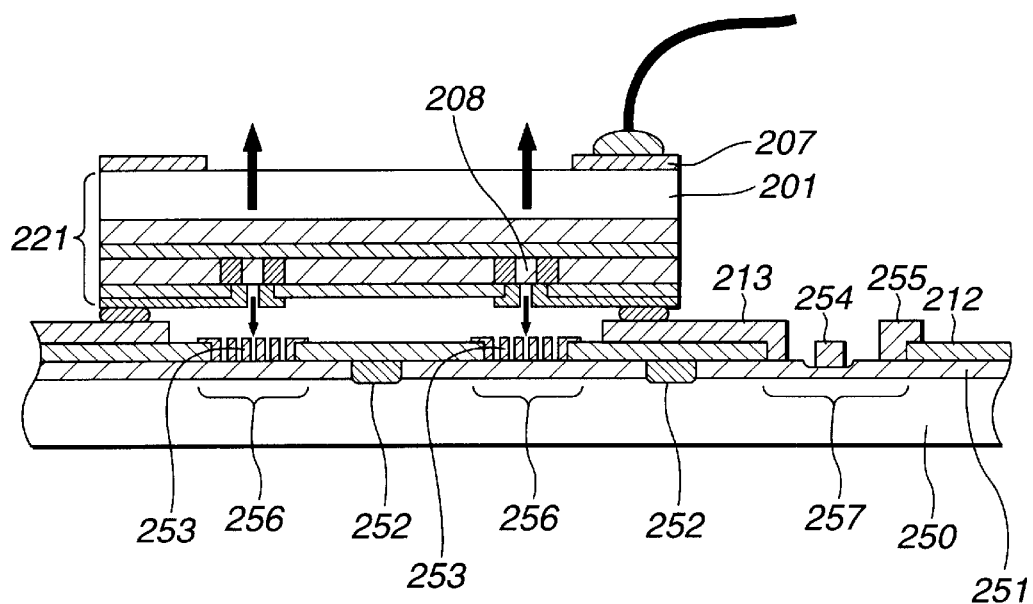
FIG. 28A is a cross-sectional view illustrating the structure of a VCSEL array module of a fifteenth embodiment according to the present invention.
Figure 28B:
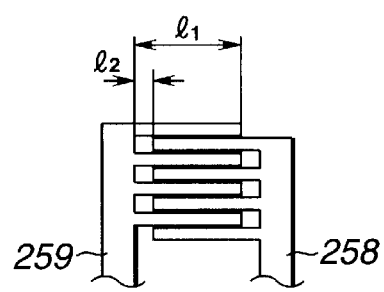
FIG. 28B is a plan view illustrating electrodes of a metal-semiconductor-metal (MSM) photodiode of the fifteenth embodiment.

A fifteenth embodiment of the present invention is directed to a configuration wherein a photodetector of a Schottky-barrier type is used as a photodetector as illustrated in FIGS. 28A and 28B. In this structure, a highly-sensitive, high-speed photodetector can be created by forming comb electrodes 258 and 259 on a semiconductor substrate as illustrated in FIG. 28B. This is an MSM (metal-semiconductor-metal)-PD.

In FIG. 28A, the same functional portions as those in FIG. 24 are designated by the same reference numerals as those in FIG. 24.

In this embodiment, an undoped GaAs buffer layer 251 (thickness: 0.5 $\mu$m) is epitaxially grown on a semi-insulating GaAs substrate 250, and the insulating layer 212 of $SiN_x$ is deposited on the buffer layer 251. After that, a window region is formed in the insulating layer 212 and the comb electrodes 258 and 259 are fabricated with $l_1$=10 $\mu$m and $l_2$=5 $\mu$m as illustrated in FIG. 28B. MSM-PDs 256 are arranged corresponding to locations of VCSELs similarly to the thirteenth embodiment, and a p-diffused layer 252 is formed to separate the devices.

Further, a field effect transistor (FET) 257 of a Schottky-barrier type is also integrated on the same substrate 250. The FET 257 acts as a driving transistor for the VCSEL. The wiring pattern 213 on the photodetector substrate 250 also serves as a drain electrode of the FET 257.

On the other hand, electrodes 253 of the MSM-PD 256 are comprised of the two comb electrodes 258 and 259 on the surface, and these are basically amphi-polar. Therefore, either of them can be a common electrode. In this embodiment, the p-substrate 201 of the VCSEL is used, Accordingly, the structure is an anode-common type, and the electrode corresponding to a common electrode of the MSM-PD 256 and the p-side electrode 207 of the VCSEL are connected to a common positive power source $V_{CC}$. The other electrode of the MSM-PD 256 is drawn outside the VCSEL substrate 221 like the thirteenth embodiment and connected to a gate electrode 254 of the FET 257 through similarly-integrated differential amplifier and LD controlling circuit (not shown in FIG. 28A). A source electrode 255 is connected to the above common ground through a resistor.

Figure 31:
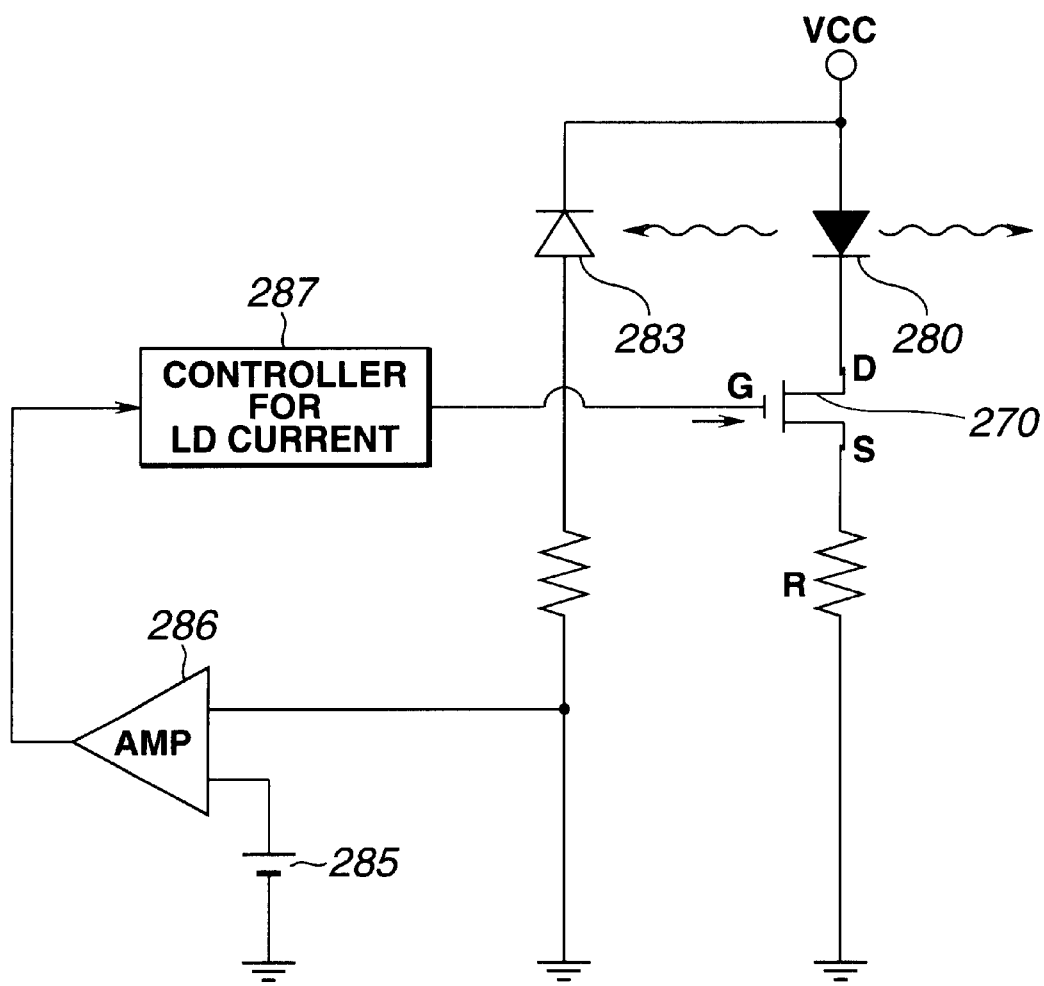
FIG. 31 is a schematic diagram of an APC circuit of a VCSEL array module in the case of a VCSEL having an anode-common structure.

According to this embodiment, a laser-array light source with integrated VCSEL, PD and APC circuit can be provided in a compact form and with excellent yield. A control system of this apparatus has a structure as illustrated in FIG. 31. The system of FIG. 31 differs from the system of FIG. 30 in that the n-side electrode of the VCSEL 280 can be directly connected to the drain D of the FET 257 (i.e., not through a resistor) and hence the integration can be advantageously achieved. Further, since a voltage of the source S can be adjusted by an automatic negative feedback using a resistor R, a current multiplication factor can be readily controlled and a stable driving control can be hence constructed.

Sixteenth Embodiment

A sixteenth embodiment of the present invention is directed to a configuration wherein an SOI (silicon on insulator or semiconductor on insulator) substrate is used as both a wiring substrate and an electronic-device substrate and laser light from VCSEL is detected by an MSM-PD like the fifteenth embodiment.

Figure 29:
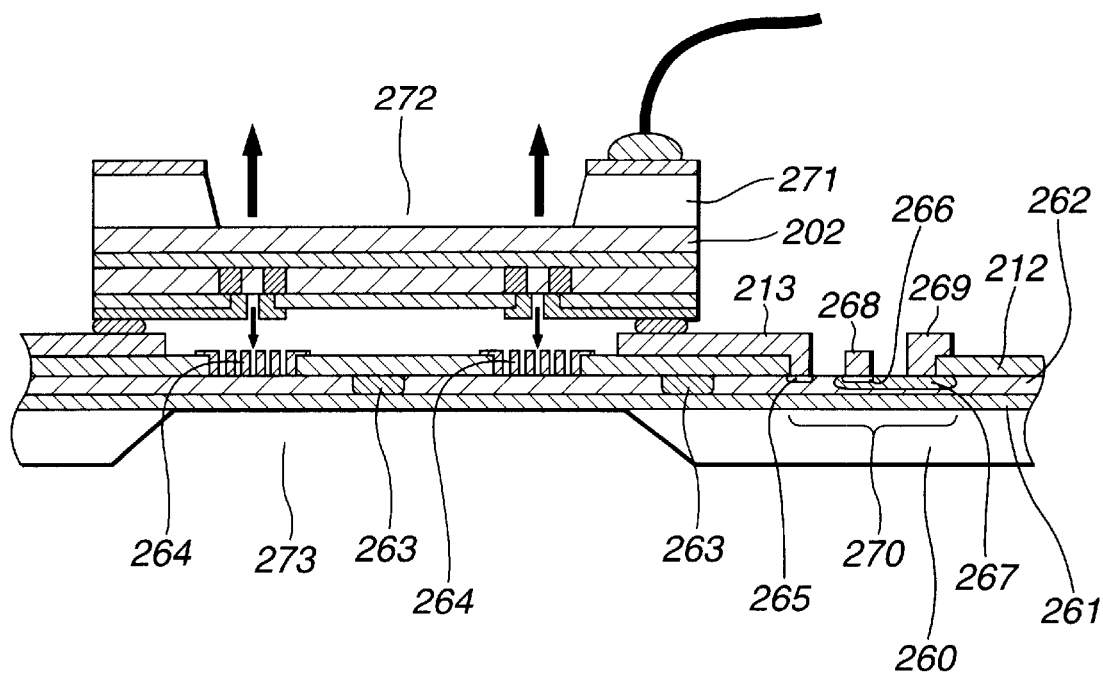
FIG. 29 is a cross-sectional view illustrating the structure of a VCSEL array module of a sixteenth embodiment according to the present invention.

As illustrated in FIG. 29, an MSM-PD array 264 is formed on an SOI substrate in which $SiO_2$ 261 and an undoped Si layer (thickness: 0.3 µm) are formed on an Si substrate 260, similarly to the fifteenth embodiment. Further, a p-diffused layer 263 for separation between devices is formed, and a bipolar transistor 270 is integrated as a driver for driving the VCSEL. In the bipolar transistor 270, the collector electrode 213 is formed in the SI layer 262 on an n-diffused layer 265, a base electrode 269 is formed on a p-diffused layer 267, and an emitter electrode 268 is formed on an n-diffused layer 266.

In this embodiment, a wiring method is the same as that of the fifteenth embodiment since a p-type substrate 271 is used like the fifteenth embodiment. A driving method of the APC is also the same as that of the fifteenth embodiment (see a circuit of FIG. 31 in which the FET is replaced by the bipolar transistor 270).

In this embodiment, the GaAs substrate 271 is absorptive to laser light since an AlGaAs/GaAs active layer (its bandgap wavelength: 0.77 µm) is epitaxially grown on the GaAs substrate 271. Therefore, a portion of the GaAs substrate 271 down to the first layer of the DBR mirror 202 is removed as illustrated in FIG. 29 to form a window region 272. Further, a portion of the Si substrate 260 down to the $SiO_2$ 261 is etched to form a window 273, so that external light can be received. Regarding a use method of the external light, the VCSEL can be driven in an inverter manner like the fourteenth embodiment.

Further, such a system is possible in which when external light is received in a time sharing method, the VCSEL is caused to act as a light receiving device with its oscillation ceased and the VCSEL is oscillated when not receiving the light. In such a system, the inter-board optical connection can be performed, or optical information transmission can be performed by coupling the oscillated light to an optical fiber. In cases like the fourteenth embodiment or this embodiment, the photodetector is not necessarily disposed at a place corresponding to the light emitting device since the photodetector may receive the external light only.

In the thirteenth to sixteenth embodiments, examples of InGaAs/GaAs series or AlGaAs/GaAs series on the GaAs substrate are described, but other materials, such as GaN series of blue radiation and GaInNAs of a long-wavelength material on a GaAs substrate, can also be used. Further, in the thirteenth to sixteenth embodiments, 8×8 two-dimensional VCSEL arrays are described, but the number is not limited thereto. One VCSEL or surface emitting device can also be used.

Seventeenth Embodiment

Figure 32:
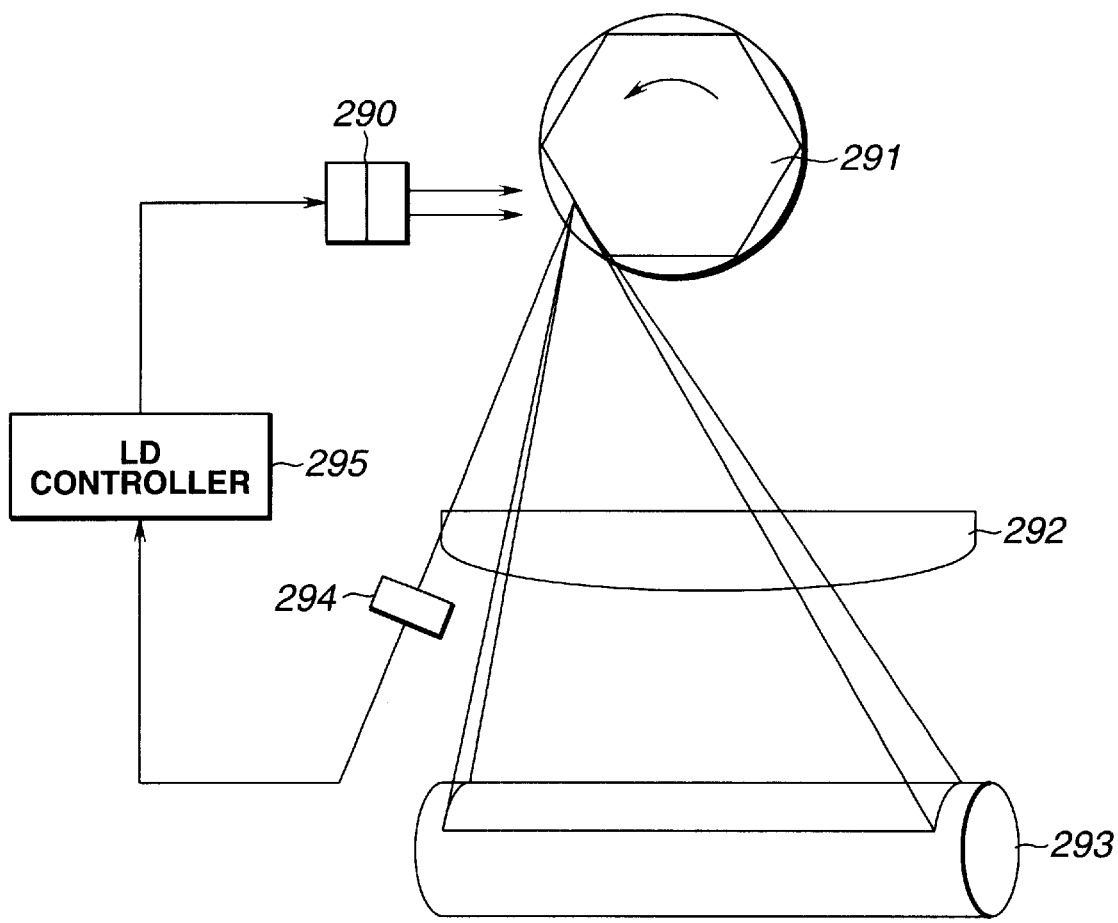
FIG. 32 is a schematic plan view illustrating the structure of an optical system of a laser beam printer using a VCSEL array module according to the present invention.

A seventeenth embodiment of the present invention is directed to a laser beam printer in which the above-discussed VCSEL array is used. FIG. 32 illustrates its schematic structure.

When a VCSEL array 290 with a photodetector of the present invention is used as a light source (VCSELs of the array 290 are arranged in an extending direction of a rotary axia of a polygonal mirror 291, i.e., a direction perpendicular to a drawing sheet or an auxiliary scanning direction), a plurality of optical writings in a band form can be carried out on a photosensitive drum 293 during a single scan as illustrated in FIG. 32. Printing can be thus achieved at a very high speed. The pitch between beams on the photosensitive drum 293 can be set to a desired amount by a lens system 292. For example, a pitch of 20 µm on the photosensitive drum 293 can be obtained by using the VCSEL array with a pitch of 125 µm between VCSELs. A one-dimensional array of eight VCSELs or the like can be more readily used than the above-discussed two-dimensional array. In this embodiment, the VCSEL of a 0.77-µm band like the sixteenth embodiment is used.

In the arrayed VCSELs of the thirteenth to sixteenth embodiments, each VCSEL can be automatically power-controlled as discussed above. Correction per each scan, however, needs to be carried out by receiving scanning light by a photodetector 294 disposed near the drum 293 to reduce a variation of light amount due to the optical system. Here, the power of each VCSEL may be monitored. However, it is easier to receive the total power of the arrayed VCSELs by a single photodetector 294 and feed back this result to the sum of LD currents through an LD controlling circuit 295.

Though there is a limit to the number of revolutions of the polygonal mirror 291. a high-speed laser beam printer can be readily achieved by using the above VCSEL array. Further, where an array of end-facet emitting lasers is used, a large amount of injection current is needed and hence power requirements increase. In contrast, when the VCSEL array of this invention is employed, power requirements can be reduced drastically (by more than one digit). The reason therefor is that the VCSEL can be driven with about 10 mA while the driving current for the end-facet emitting laser is about 50 mA.

The apparatus of this invention can be likewise used as a light source in inter-board optical interconnections, CD-ROM systems, magnetooptical disc systems and the like. When light is coupled to the optical fiber for light transmission, this apparatus of this invention can also be used as a light source in large-capacity optical parallel transmissions.

Except as otherwise disclosed herein, the various components shown in outline or block form in any of FIGS. 1–32 are individually well known in the optical semiconductor device, electronic circuit devices, IC techniques and optical printing sytems and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. An apparatus with an optical functional device comprising:

a first substrate;

an array region provided on said first substrate, said array region including a plurality of first optical functional devices;

a plurality of first electrical connecting portions for injecting a current into or applying a voltage to said first optical functional devices, said first electrical connecting portions respectively including a first extension portion extending to an outside of said array region and a first pad portion connected to said extension portion outside said array region;

a second substrate; and a plurality of second electrical connecting portions, said second electrical connecting portions respectively being formed on said second substrate and including a second pad portion, said first pad portion and said second pad portion being electrically connected to each other outside said array region.

2. An apparatus with an optical functional device according to claim 1, wherein at least one of input light and output light travels into and from said first optical functional devices on a side of said first substrate.

3. An apparatus with an optical functional device according to claim 2, wherein a portion of said first substrate corresponding to said array region is removed to form a window region.

4. An apparatus with an optical functional device according to claim 2, wherein said first substrate is formed of material transparent to light which is treated by said first optical functional devices.

5. An apparatus with an optical functional device according to claim 1, wherein at least one of input light and output light travels into and from said first optical functional devices on a side of said second substrate.

6. An apparatus with an optical functional device according to claim 5, wherein said second substrate is formed of material transparent to light which is treated by said first optical functional devices.

7. An apparatus with an optical functional device according to claim 5, further comprising guide means for guiding the at least one of input light and output light into and from said first optical functional devices, and wherein said guide means is provided at a portion of said second substrate corresponding to a location of said first optical functional devices.

8. An apparatus with an optical functional device according to claim 7, wherein said guide means comprises a microlens formed in said second substrate.

9. An apparatus with an optical functional device according to claim 7, wherein said guide means comprises a Fresnel lens formed in said second substrate.

10. An apparatus with an optical functional device according to claim 7, wherein said guide means comprises an optical fiber fixed to said second substrate.

11. An apparatus with an optical functional device according to claim 10, wherein a hole is formed in said second substrate, and said optical fiber is fixed in said hole.

12. An apparatus with an optical functional device according to claim 7, further comprising a third substrate with a hole bonded to said second substrate, and wherein said guide means comprises an optical fiber fixed in said hole.

13. An apparatus with an optical functional device according to claim 1, wherein said first optical functional devices comprise surface emitting light-radiating devices for emitting light perpendicular to said first substrate.

14. An apparatus with an optical functional device according to claim 13, wherein said first optical functional devices comprise vertical cavity surface emitting lasers (VCSEL) with an active layer sandwiched between a pair of reflective mirrors.

15. An apparatus with an optical functional device according to claim 1, wherein said first optical functional devices comprise photodetectors for converting received light to an electric signal.

16. An apparatus with an optical functional device according to claim 1, further comprising a photodetector provided on said second substrate, and wherein said first optical functional devices comprise surface emitting light-radiating devices for emitting light perpendicular to said first substrate.

17. An apparatus with an optical functional device according to claim 16, wherein said photodetector is positioned oppositely to said surface emitting light-radiating devices to receive light from said surface emitting light-radiating devices.

18. An apparatus with an optical functional device according to claim 16, wherein said photodetector is positioned oppositely to said surface emitting light-radiating devices to receive both external light and light from said surface emitting light-radiating devices.

19. An apparatus with an optical functional device according to claim 18, wherein said photodetector is positioned on a face of said second substrate opposite to a face of said second substrate bonded to said first substrate to receive the external light.

20. An apparatus with an optical functional device according to claim 18, wherein said photodetector is positioned on a portion of said second substrate, at which material of said second substrate is removed to form a window region, to receive the external light.

21. An apparatus with an optical functional device according to claim 16, wherein said second pad portion is formed outside said photodetector.

22. An apparatus with an optical functional device according to claim 16, further comprising a plurality of third electrical connecting portions formed on said second substrate for said photodetector, electrically connected to said photodetector, said third electrical connecting portions respectively including a third extension portion extending to an outside of said photodetector and a third pad portion connected to said third extension portion outside said photodetector.

23. An apparatus with an optical functional device according to claim 22, wherein said photodetector comprises a pin-photodiode, an electrode of said pin-photodiode being one of said third electrical connecting portions and another electrode of said pin-photodiode being formed on an entire face of said second substrate opposite to a face of said second substrate on which said photodetector is provided.

24. An apparatus with an optical functional device according to claim 22, wherein said photodetector comprises a metal-semiconductor-metal (MSM)-photodiode, an electrode of said MSM-photodiode being one of said third electrical connecting portions and another electrode of said MSM-photodiode being a fourth electrical connecting portion drawn from said MSM-photodiode to an outside of said MSM-photodiode.

25. An apparatus with an optical functional device according to claim 16, wherein a plurality of arrayed photodetectors are provided on said second substrate corresponding to said plurality of first optical functional devices provided on said first substrate.

26. An apparatus with an optical functional device according to claim 16, wherein said photodetector receives light from said surface emitting light-radiating devices and feedback controls said surface emitting light-radiating devices based on the received light such that a light output of said surface emitting light-radiating devices is stabilized.

27. An apparatus with an optical functional device according to claim 16, wherein said photodetector receives both external light and light from said surface emitting light-radiating devices and feedback controls said surface emitting light-radiating devices based on the received light such that a light output of said surface emitting light-radiating devices is stabilized and said surface emitting light-radiating devices can act as an optical inverter.

28. An apparatus with an optical functional device according to claim 1, wherein said first pad portion and said second pad portion are bonded with solder.

29. An apparatus with an optical functional device according to claim 1, wherein said first pad portion and said second pad portion are bonded with anisotropic electrically-conductive adhesive or electrically-conductive adhesive.

30. An apparatus with an optical functional device according to claim 1, wherein said first pad portion and said second pad portion are bonded by pressing said first and second pad portions against each other.

31. An apparatus with an optical functional device according to claim 1, further comprising a metal bump for radiating heat generated by said first optical functional devices to said second substrate, said metal bump being placed between said first optical functional devices and said second substrate and said metal bump being electrically independent.

32. An apparatus with an optical functional device according to claim 1, further comprising resin packed in a space created between said first optical functional devices and said second substrate.

33. An apparatus with an optical functional device according to claim 1, wherein said second substrate is mounted to a package or a print-circuit board directly or through another substrate.

34. An apparatus with an optical functional device according to claim 1, further comprising a package, said package acting as a heat sink and said first substrate being entirely bonded to an inner surface of said package.

35. An apparatus with an optical functional device according to claim 1, wherein said second substrate comprises a substrate of a semiconductor single crystal, and said second substrate includes an electronic functional device, a driver for the electronic functional device and a controller for the electronic functional device integrated on said second substrate.

36. An apparatus with an optical functional device according to claim 1, wherein said first substrate includes a groove structure for preventing a short circuit through an end facet of said first substrate, said groove structure being formed around at least one of said first optical functional devices.

* * * * *

UNITED STATES PATENT AND TRADEMARK OFFICE
CERTIFICATE OF CORRECTION

PATENT NO. : 6,597,713 B2
DATED : July 22, 2003
INVENTOR(S) : Toshihiko Ouchi

It is certified that error appears in the above-identified patent and that said Letters Patent is hereby corrected as shown below:

Column 5,
Line 13, "and the" should read -- the --.

Column 6,
Line 17, "first and" should read -- first --.

Column 10,
Line 15, "trasparent" should read -- transparent --.

Column 15,
Line 45, "desribed" should read -- described --.

Column 17,
Line 29, "gude" should read -- guide --.

Column 18,
Line 25, "trasparent" should read -- transparent --; and
Line 63, "material" should read -- material from --.

Column 19,
Line 1, "absoptive" should read -- absorptive --; and
Line 41, "wiil" should read -- will --.

Column 20,
Line 51, "used," should read -- used. --

UNITED STATES PATENT AND TRADEMARK OFFICE
CERTIFICATE OF CORRECTION

PATENT NO. : 6,597,713 B2
DATED : July 22, 2003
INVENTOR(S) : Toshihiko Ouchi

It is certified that error appears in the above-identified patent and that said Letters Patent is hereby corrected as shown below:

Column 22,
Line 4, "axia" should read -- axis --; and
Line 29, "mirror 291." should read -- mirror 291, --.

Signed and Sealed this

Sixteenth Day of March, 2004

JON W. DUDAS
*Acting Director of the United States Patent and Trademark Office*